United States Patent [19]
Aoyama et al.

[11] Patent Number: 6,156,599
[45] Date of Patent: Dec. 5, 2000

[54] METHOD OF MAKING A SEMICONDUCTOR DEVICE WITH CAPACITOR

[75] Inventors: Tomonori Aoyama; Keitaro Imai, both of Kawasaki, Japan

[73] Assignee: Kabushiki Kaisha Toshiba, Kawasaki, Japan

[21] Appl. No.: 09/189,943

[22] Filed: Nov. 12, 1998

Related U.S. Application Data

[62] Division of application No. 08/681,537, Jul. 23, 1996, Pat. No. 5,852,307.

[30] Foreign Application Priority Data

Jul. 28, 1995 [JP] Japan .................................. 7-193677
Dec. 8, 1995 [JP] Japan .................................. 7-320720

[51] Int. Cl.[7] .............................................. H01L 21/8244
[52] U.S. Cl. ......................... 438/238; 438/238; 438/239
[58] Field of Search ............................. 438/68, 460, 75, 438/98; 427/226, 96, 126, 284; 437/190, 60, 235, 195; 156/626, 651, 652, 656

[56] References Cited

U.S. PATENT DOCUMENTS

| | | |
|---|---|---|
| 4,959,745 | 9/1990 | Suguro . |
| 5,183,780 | 2/1993 | Noguchi et al. .................. 437/173 |
| 5,336,638 | 8/1994 | Suzuki et al. ...................... 437/190 |
| 5,576,928 | 11/1996 | Summerfelt et al. . |
| 5,599,741 | 2/1997 | Matsumoto et al. ................. 437/192 |
| 5,695,815 | 12/1997 | Vaartstra .............................. 427/226 |
| 5,985,690 | 11/1999 | Fujikura .................................. 438/68 |

FOREIGN PATENT DOCUMENTS

| | | |
|---|---|---|
| 5-251258 | 9/1993 | Japan . |
| 6-87490 | 11/1994 | Japan . |
| 6-338599 | 12/1994 | Japan . |
| 7-94680 | 4/1995 | Japan . |

*Primary Examiner*—David Nelms
*Assistant Examiner*—Phuc T. Dang
*Attorney, Agent, or Firm*—Oblon, Spivak, McClelland, Maier & Neustadt, P.C.

[57] ABSTRACT

A semiconductor device comprising a semiconductor substrate and a capacitor formed on the semiconductor substrate, wherein the capacitor is formed of a multilayer comprising a first electrode disposed close to the semiconductor substrate, a second electrode disposed remote from the semiconductor substrate and a dielectric film formed of a metal oxide and interposed between the first electrode and the second electrode, and at least either one of the first and second electrodes contains oxygen and is constituted by an element selected from either one of Group 7A and Group 8 elements belonging to either one of the fifth and sixth periods of Periodic Table, the content of oxygen being in a range of 0.004 to 5 atom. %.

10 Claims, 18 Drawing Sheets

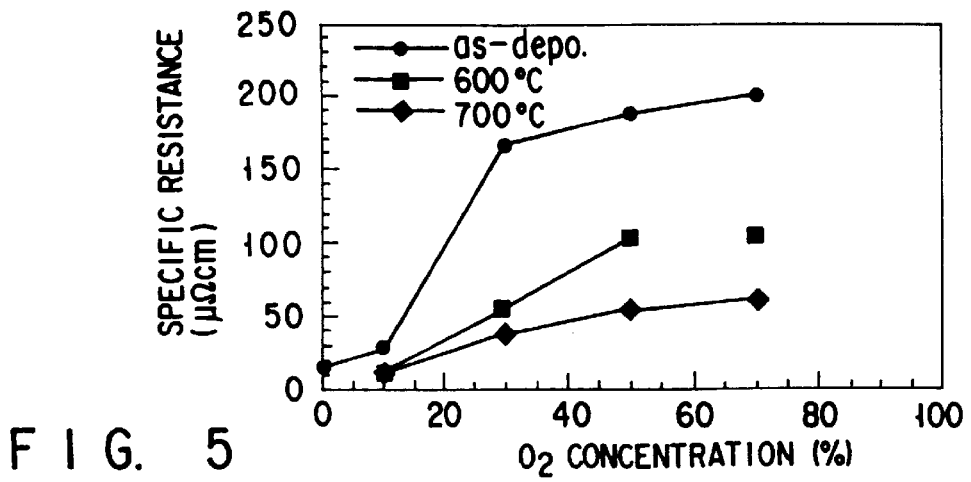
F I G. 5
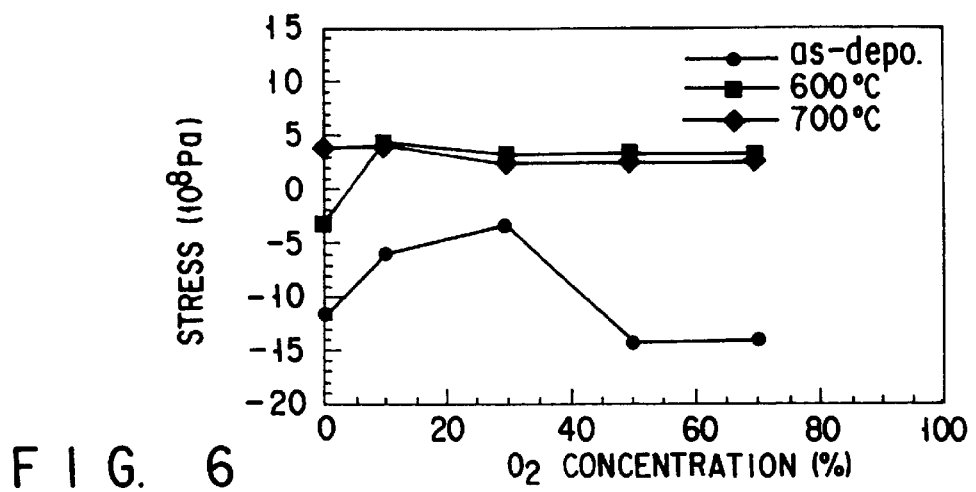
F I G. 6
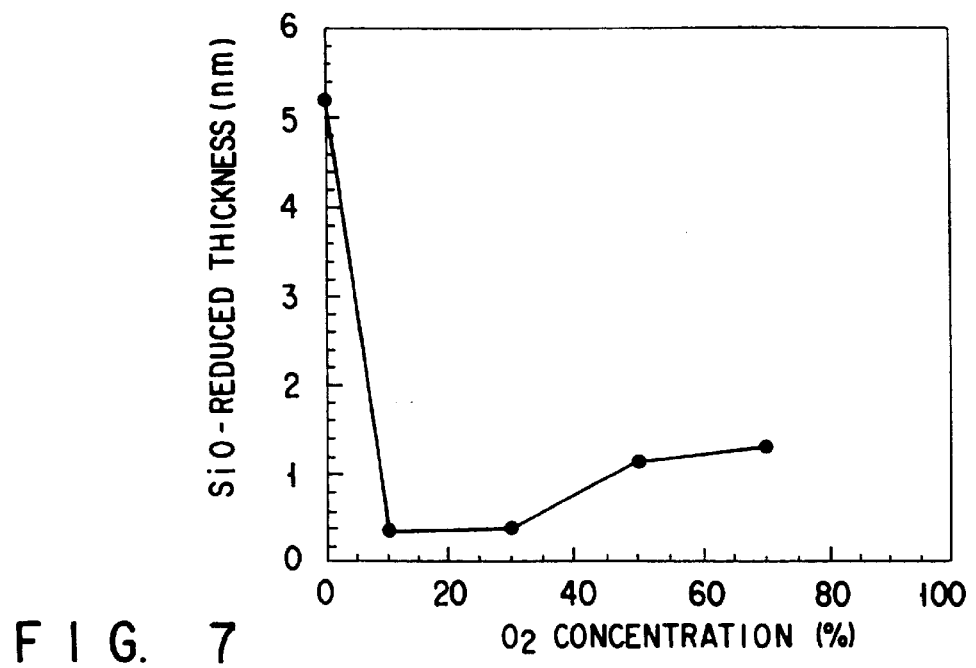
F I G. 7

METHOD OF MAKING A SEMICONDUCTOR DEVICE WITH CAPACITOR

This application is a Division of application Ser. No. 08/681,537 Filed on Jul. 23, 1996 now U.S. Pat. No. 5,852,307.

BACKGROUND OF THE INVENTION

1. Field of the Invention

This invention relates to a semiconductor device, and in particular to a semiconductor device provided with a capacitor comprising a dielectric film made of a metal oxide, and to a method of manufacturing the semiconductor device.

2. Description of the Related Art

With a recent trend to increase the integration density of a semiconductor integrated circuit, the circuit pattern thereof becomes increasingly finer. For example, the size of cell for a capacitor has become extremely small. As the cell size of a capacitor becomes small in this manner, the capacitance of the capacitor will also be reduced correspondingly. However, there is a limitation on the reduction of the capacitance of the capacitor in view of sensitivity or soft error of the device.

In an attempt to solve this problem, there has been proposed to form a three-dimensional capacitor so as to increase the cell area and hence the capacitance as much as possible. However, there is a problem in this case that the working of a capacitor and the formation of electrodes or insulating film become increasingly difficult.

Under such circumstances, there has been studied recently to employ a film having a high dielectric constant as an insulating film for capacitor. Typical examples of such an insulating film having a high dielectric constant include a $Ba_xSr_{1-x}TiO_3$ film having a perovskite crystal structure. If this $Ba_xSr_{1-x}TiO_3$ film is to be employed, a noble metal such as platinum which is free from oxidation even in an oxidizing atmosphere is required to be used for a storage node electrode.

However, since the dry etching of such a noble metal is rather difficult, there has been studied to employ a metal oxide as the storage node electrode, which is capable of exhibiting almost the equivalent conductivity to a metal. Typical examples of such a metal oxide include ruthenium dioxide ($RuO_2$). A method of forming a capacitor using this $RuO_2$ will be explained as follows.

First of all, as shown in FIG. 1A, an isolation region 2 is formed in a p-type Si substrate 1, and then a gate insulating film 3a, a gate electrode (word line) 3b and an $n^+$ diffusion region 4 of a transistor are formed. Thereafter, an insulating interlayer 5a is deposited to flatten the surface of the substrate and then a bit line 6 is formed. Subsequently, another insulating interlayer 5b is deposited again, a contact hole is formed, and then this contact hole is buried with an $n^+$ type polycrystal Si film 7.

Then, as shown in FIG. 1B, a TiN film 14 is deposited as a diffusion barrier film (a barrier metal) and a $RuO_2$ film 15 is deposited over the TiN film 14. Subsequently, a $SiO_2$ film 16 is deposited as shown in FIG. 1C and then subjected to a photolithographic process to form a capacitor pattern.

Then, as shown in FIG. 1D, the $RuO_2$ film 15 is processed by way of a reactive ion etching with the $SiO_2$ film 16 being used as a mask, the $SiO_2$ film 16 being subsequently removed by means of etching. Subsequently, as shown in FIG. 1E, the TiN film 14 is processed by way of a reactive ion etching with the $RuO_2$ film 15 being used as a mask.

Thereafter, as shown in FIG. 1F, the $Ba_xSr_{1-x}TiO_3$ film 9 is deposited as a capacitor insulating film and then heat-treated in an oxygen atmosphere. Finally, a $WN_x$ film 10 is deposited and worked to form an upper electrode.

However, the capacitor formed according to the aforementioned method is accompanied with the following problems. Namely, the surface of TiN film 14 constituting a diffusion-preventing film is oxidized in the step of forming the $RuO_2$ film 15, forming a $TiO_x$ film 21 as shown in FIG. 2A thereby increasing the contact resistance. Alternatively, the $RuO_2$ is reduced and the TiN film is oxidized in the step of forming the $Ba_xSr_{1-x}TiO_3$ film 9 thereby increasing the contact resistance.

In an attempt to solve this problem, ruthenium (Ru) film 22 may be deposited in subsequent to the formation of the TiN film 14 constituting a diffusion-preventing film, and then the $RuO_2$ film 15 is further deposited on the ruthenium (Ru) film 22. However, even in such a process, the side wall of the TiN film 14 is caused to be exposed after the working of electrodes so that the side wall of the TiN film 14 is oxidized as shown in FIG. 2B during the film-forming step of the $Ba_xSr_{1-x}TiO_3$ film 9 or during the subsequent heating treatment, thus increasing the leakage current or deteriorating the capacitance of the device.

On the other hand, when the $RuO_2$ film 15 is directly contacted with the Si plug 7 as shown in FIG. 3A, a $SiO_2$ film 23 is caused to be formed at an interface between the $RuO_2$ film 15 and the Si plug 7 in the same manner as between the $RuO_2$ film 15 and the TiN, thereby giving rise to an increase in contact resistance. Furthermore, if ruthenium is directly contacted with the Si plug, a ruthenium silicide 24 is caused to be formed as shown in FIG. 3B as a result of reaction between Ru and Si, and a SiO2 film 25 is caused to be formed between the $Ba_xSr_{1-x}TiO_3$ film and the ruthenium silicide 24, thereby giving rise to a problem of deteriorating the capacitance. Namely, it has been very difficult according to the conventional method to employ the $RuO_2$ film or Ru film as a material for electrodes of a high dielectric capacitor.

As explained above, when a material having a high dielectric constant such as $Ba_xSr_{1-x}TiO_3$ is to be used as a material for a capacitor insulating film, a material which is capable of exhibiting a metallic conductivity even if it is oxidized, such as a ruthenium film or a ruthenium oxide film is required to be used as an electrode for a capacitor. However, the employment of such a material for an electrode is accompanied with the aforementioned problem that the electrode may be silicified as it is contacted with Si. On the other hand, if a diffusion-preventing film such as TiN is employed for the purpose of preventing the formation of a silicide, the diffusion-preventing film may be oxidized thereby giving rise to a problem of increasing the contact resistance.

SUMMARY OF THE INVENTION

Accordingly, an object of the present invention is to provide a semiconductor device wherein a metal oxide is used as a material for a capacitor insulating film, which is capable of omitting the employment of a diffusion-preventing film and of preventing the capacitor electrode thereof from being silicified, and a method of manufacturing such a semiconductor device.

Another object of this invention is to provide a semiconductor device wherein a metal oxide is used as a material for a capacitor insulating film, which is capable of preventing an increase in contact resistance that might be induced from an oxidation of a diffusion-preventing film functioning as a barrier metal.

Namely, according to the present invention, there is provided a semiconductor device comprising a semiconductor substrate and a capacitor formed on the semiconductor substrate, wherein the capacitor is formed of a multilayer including a first electrode, a second electrode and a dielectric film formed of a metal oxide and interposed between the first electrode and the second electrode, and at least one of the first and second electrodes contains oxygen and is constituted by at least one element selected from either one of Group 7A and Group 8 elements belonging to either one of the fifth and sixth periods of Periodic Table, the content of oxygen being less than a stoichiometric quantity of oxygen that can exist in a form of an oxide of the element.

According to the present invention, there is further provided a semiconductor device comprising a silicon substrate and a capacitor formed on the silicon substrate, wherein the capacitor is formed of a multilayer comprising a first electrode, a second electrode and a dielectric film formed of a metal oxide and interposed between the first electrode and the second electrode, wherein at least one of the first and second electrodes is formed of a metal element, oxide of which is conductive, or a compound of the metal element and disposed to be in contact with a conductive region of the silicon substrate or with a conductive layer containing silicon, and wherein a mixed oxide layer comprising silicon and the metal element is interposed between at least one of the first and second electrodes and the conductive region or the conductive layer containing silicon.

Further, according to the present invention, there is also provided a method of manufacturing a semiconductor device provided with a capacitor comprising a first electrode, a dielectric film and a second electrode which comprises the steps of:

forming a metal film to be the first electrode on a semiconductor substrate by sputtering at least one element selected from either one of Group 7A and Group 8 elements belonging to either one of the fifth and sixth periods of Periodic Table in an atmosphere containing oxygen, the metal film containing oxygen, a content of which is less than a stoichiometric quantity of oxygen that can exist in a form of an oxide of the element;

forming a dielectric film made of a metal oxide on the metal film; and forming a second electrode on the dielectric film.

Moreover, according to the present invention, there is further provided a method of manufacturing a semiconductor device provided with a capacitor comprising a first electrode, a dielectric film and a second electrode which comprises the steps of:

depositing a metal film to be the first electrode on a semiconductor substrate by subjecting at least one element selected from either one of Group 7A and Group 8 elements belonging to either one of the fifth and sixth periods of Periodic Table to a chemical vapor phase growth in an atmosphere containing oxygen, the metal film containing oxygen a content of which is less than a stoichiometric quantity of oxygen that can exist in a form of an oxide of the element;

forming a dielectric film made of a metal oxide on the metal film; and forming a second electrode on the dielectric film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a graph showing changes of specific resistance in relative to the concentration of oxygen at the process of forming a film;

FIG. 6 is a graph showing changes of stress in relative to the concentration of oxygen at the process of forming a film;

FIG. 7 is a graph showing changes of $SiO_2$-reduced film thickness (calculated as a $SiO_2$) in relative to the concentration of oxygen at the process of forming a film;

DETAILED DESCRIPTION OF THE PREFERRED EMBODIMENTS

Figure 1A:
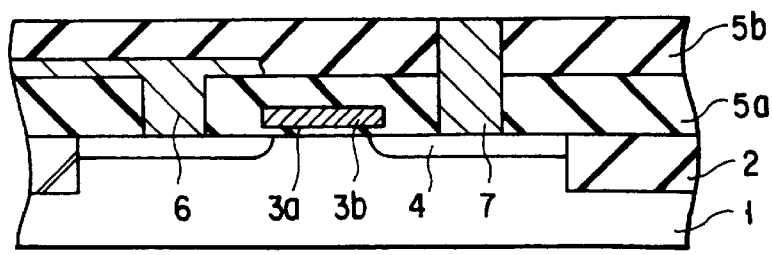
FIGS. 1A to 1F respectively shows a cross-sectional view illustrating a process for manufacturing a semiconductor device of the prior art.
Figure 1B:
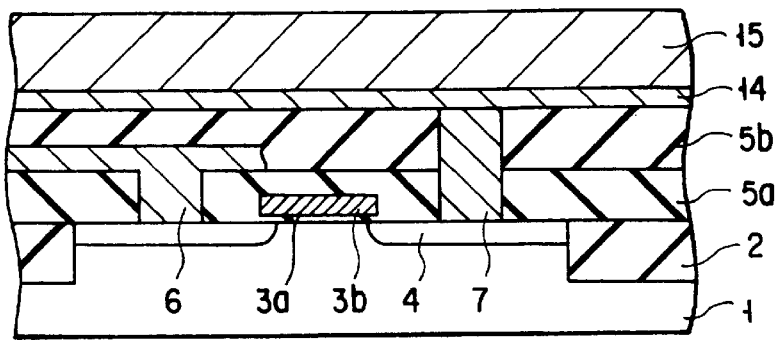
Figure 1C:
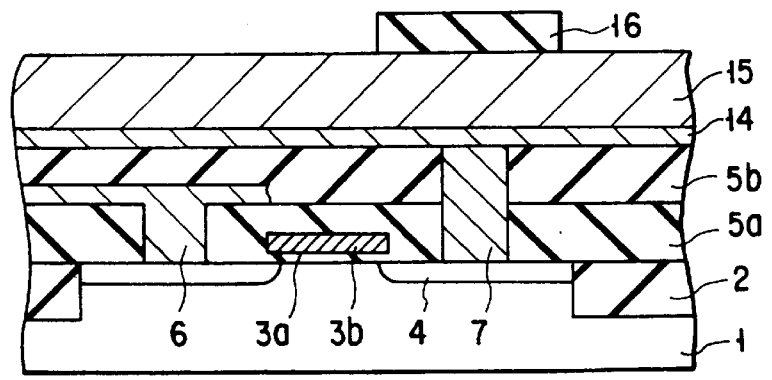
Figure 1D:
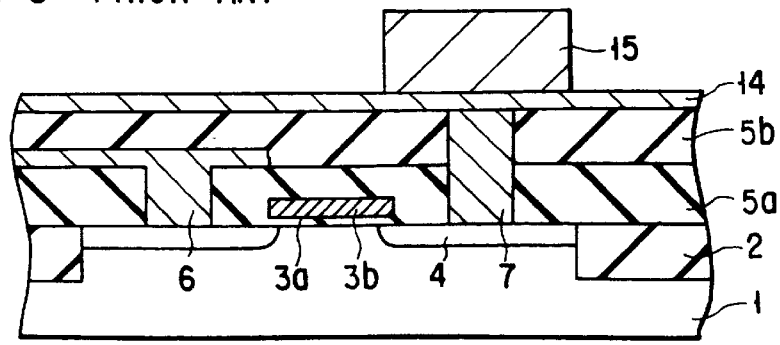
Figure 1E:
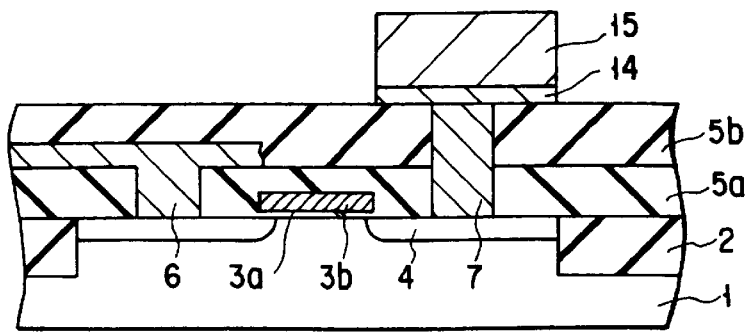
Figure 1F:
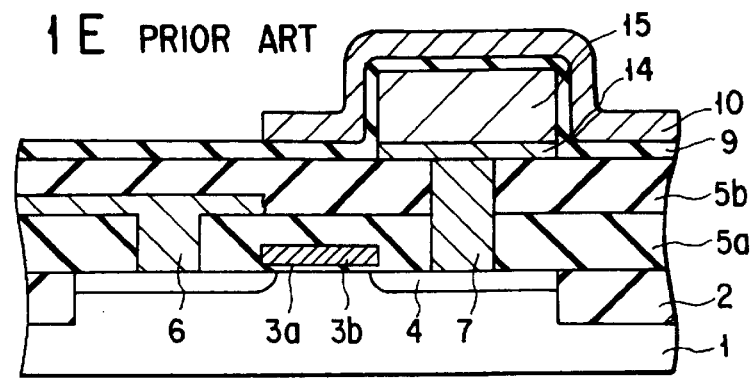
Figure 2A:
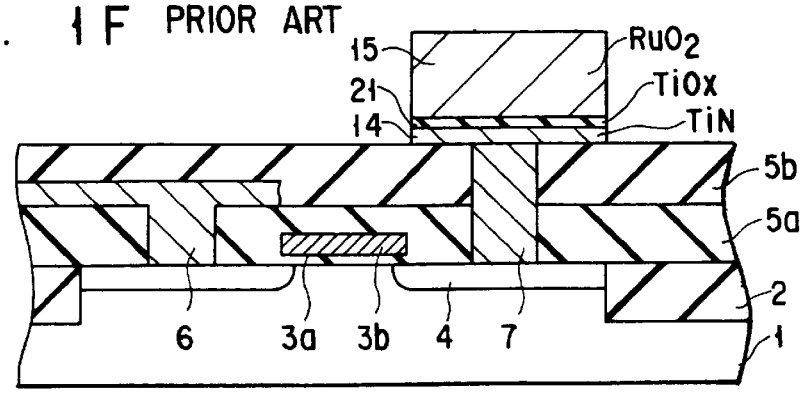
FIGS. 2A and 2B respectively shows a cross-sectional view illustrating problems accompanied with the conventional technique.
Figure 2B:
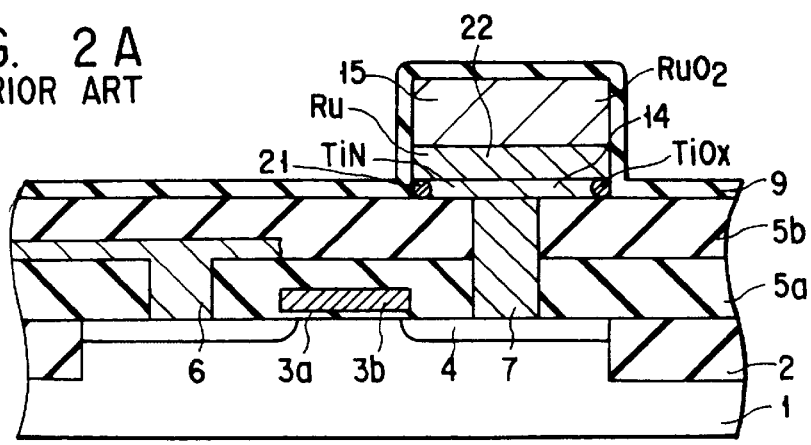
Figure 3A:
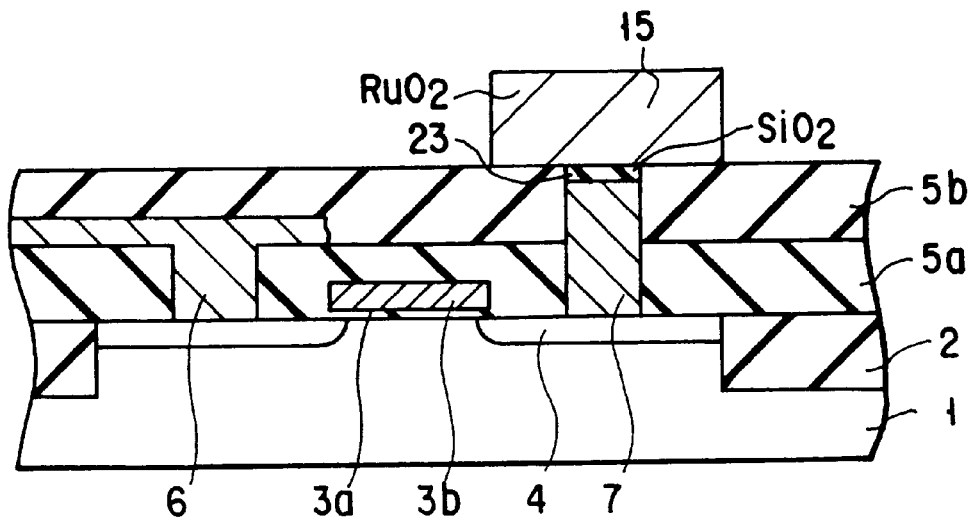
FIGS. 3A and 3B respectively shows a cross-sectional view illustrating problems accompanied with the conventional technique.
Figure 3B:
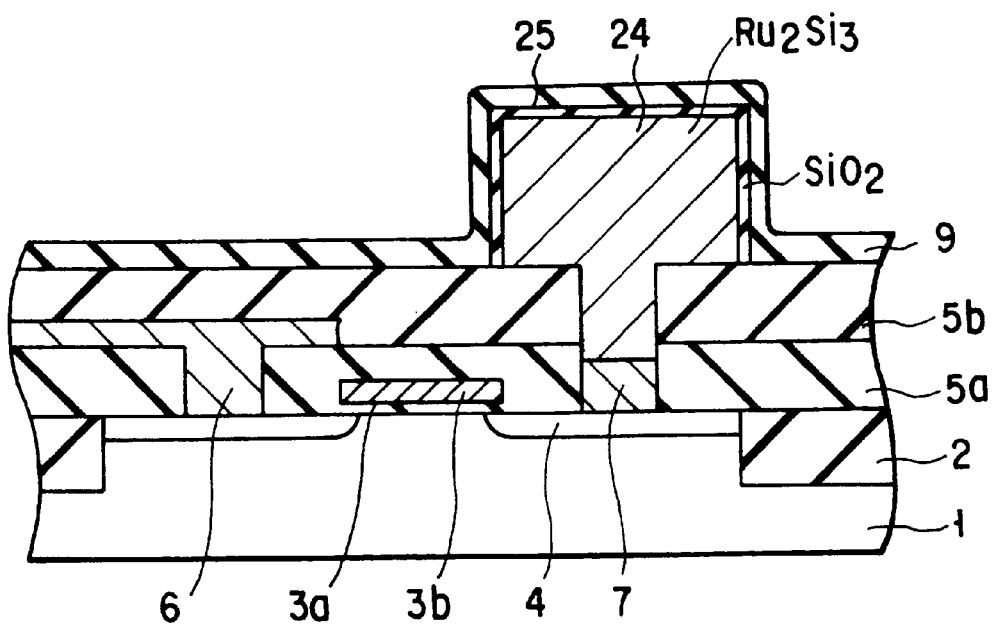

A semiconductor device according to a first embodiment of this invention is featured in that it comprises a semiconductor substrate, and a capacitor formed on this semiconductor substrate, and that at least one of a pair of electrodes constituting the capacitor is formed of a conductive material containing extremely small quantities of oxygen.

As for the conductive material containing extremely small quantities of oxygen, a metal or a compound thereof which is capable of exhibiting conductivity even in a form of an oxide thereof can be employed. Examples of such a metal or a compound thereof that is capable of exhibiting conductivity even in a form of an oxide thereof include an element selected from either one of Group 7A and Group 8 elements belonging to either one of the fifth and sixth periods of Periodic Table, or a compound thereof. Specific examples of such an element and compounds thereof are platinum, ruthenium, palladium, rhenium, osmium, iridium, rhodium, compounds of these elements and alloys of these elements. Among them, a most preferable conductive material is ruthenium.

The amount of oxygen to be contained in the conductive material should preferably be less than a stoichiometric quantity of oxygen that can be existed in a form of an oxide of the element, more preferably 0.004 to 5 atom %, most preferably 0.1 to 5 atom %. If the content of oxygen is too little, the effect to be obtained by the inclusion of oxygen would not be attained. On the other hand, if the content of oxygen is too much, a very large compressive stress may be generated in the step of film deposition so that the film formed may be easily peeled off.

The dielectric film constituting the capacitor is formed of a metal oxide, examples thereof being a $Ba_xSr_{1-x}TiO_3$ film, a $SrTiO_3$ film, a PZT film and a $Ta_2O_5$ film.

An oxide layer of the conductive material may be interposed at the interface between the electrode formed of a conductive material containing small quantities of oxygen and the dielectric film. The thickness of this oxide layer should preferably be 20 nm or less. When the thickness of the oxide layer is more than 20 nm, the surface morphology of the oxide layer grows bad and the property thereof deteriorates.

The electrode formed of a conductive material containing small quantities of oxygen may be formed in a conductive region of the surface of a silicon substrate, or may be formed in such a manner as to contact with a polycrystal silicon layer formed on a silicon substrate.

A semiconductor device according to a second embodiment of this invention is featured in that it comprises a silicon substrate and a capacitor formed on the silicon substrate, wherein said capacitor is formed of a multilayer comprising a first electrode disposed close to said silicon substrate, a second electrode disposed remote from said silicon substrate and a dielectric film formed of a metal oxide and interposed between said first electrode and said second electrode, and at least either one of said first and second electrodes is formed of a metal element, oxide of which is conductive, or a compound of said metal element and disposed to contact with a conductive region of the silicon substrate or with a conductive layer containing silicon, a mixed oxide layer comprising silicon and said metal element being interposed between at least either one of said first and second electrodes and said conductive region or said conductive layer containing silicon.

The thickness of the mixed oxide layer of the conductive material should preferably be 1 to 10 nm, more preferably 1 to 7 nm.

This mixed oxide layer may be manufactured in various methods as illustrated below.

(1) After a conductive material containing extremely small quantities of oxygen is deposited on a silicon substrate, the resultant layer is heat-treated.

(2) After an oxide film of a conductive material having a thickness of 0.5 to 6.5 nm is deposited on a silicon substrate, the resultant layer is heat-treated, and then a conductive material for forming an electrode is deposited on the oxide film.

(3) A two-source sputtering using silicon and a conductive material is performed in an atmosphere containing oxygen, or a reactive sputtering is performed using a silicide of a conductive material as a target, and then a conductive material for forming an electrode is deposited on the film obtained by the aforementioned sputtering.

Oxygen may or may not be incorporated in the conductive material employed in the aforementioned methods (2) and (3). However, it is preferable to employ a conductive material containing oxygen.

The capacitor in the semiconductor device of this invention may be used for constituting a cell capacitor of a dynamic random access memory.

According to the semiconductor device of this invention, the electrode composed of a conductive material containing small quantities of oxygen may be formed by performing the formation of conductive material film in an atmosphere containing oxygen. As for the method of forming the conductive material film, a sputtering or a CVD method may be employed. The concentration of oxygen in the aforementioned atmosphere containing oxygen should preferably be 1 to 40%.

When the formation of the conductive material film is performed as mentioned above, it is possible to obtain an electrode of low resistance while avoiding any possibility of forming a suicide even if the film is heat-treated after the conductive material film is formed on a Si substrate or a polycrystal silicon layer.

By the way, when the conductive material film containing small quantities of oxygen and formed in an oxygen-containing atmosphere is heat-treated, a film having the orientation of <001> can be obtained, so that the crystallinity after heat treatment of the high dielectric film can be improved, thus making it possible to achieve a high dielectric constant. Further, when the conductive material film containing small quantities of oxygen and formed in an oxygen-containing atmosphere is worked to form an electrode and then heat-treated, a film having as the top surface a (001) crystal face, and as the side surfaces a (110) crystal face, a (1-10) crystal face, a (–110) crystal face and a (−1-10) crystal face can be obtained so that the crystallinity after heat treatment of the high dielectric film at both of the top and side surfaces of the storage node would become excellent, thus making it possible to obtain a high capacitance.

A mechanism which makes it possible to obtain an excellent effect by the inclusion of small quantities of oxygen in the electrode for a capacitor according to this invention will be explained taking a case for example where ruthenium is employed as an electrode material.

Figure 4:
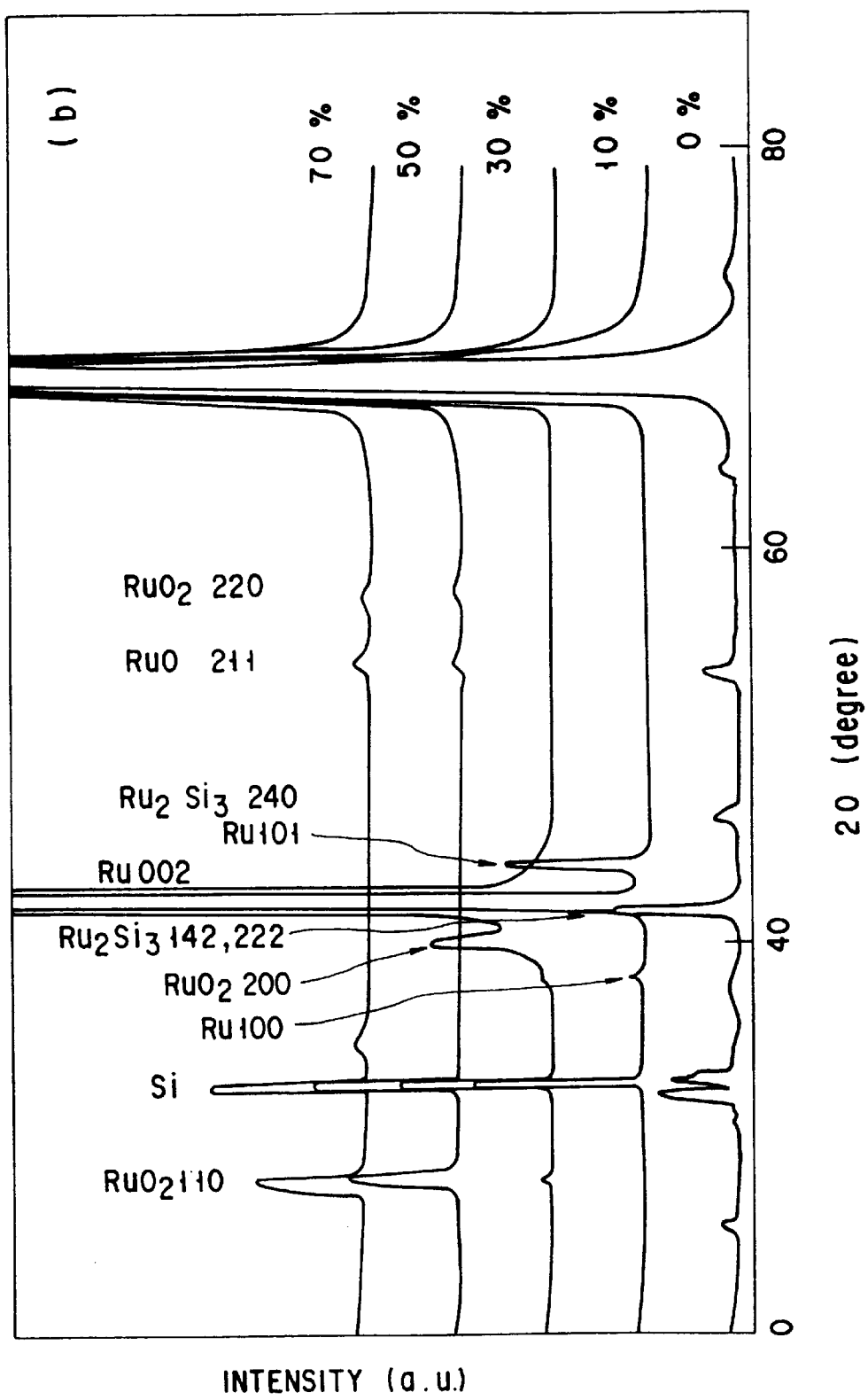
FIG. 4 is a graph showing an X-ray diffraction spectrum obtained after a heat treatment in relative to the concentration of oxygen at the process of forming a film.

FIG. 4 shows a graph of a spectrum of the X-ray diffraction of a Ru film or a $RuO_2$ film which has been formed taking the oxygen concentration as a parameter during a film-forming process on a Si wafer and then heat-treated for one minute in a $N_2$ atmosphere at a temperature of 700° C.

It can be seen from FIG. 4 that a Ru film which has been formed without incorporating oxygen at all was turned into $Ru_2Si_3$ upon the heat treatment thereof, whereas a Ru film which has been formed with an incorporation of oxygen did not exhibit a phenomenon of silicification. Further, when 10% of oxygen is incorporated in the film-forming step, only the peak of Ru was recognized. However, when 30% of oxygen is incorporated in the film-forming step, the peak of $RuO_2$ was recognized more or less, and when 50% or more of oxygen is incorporated in the film-forming step, the Ru film was completely turned into $RuO_2$. It can also be admitted that when the Ru film which was obtained in an atmosphere containing 10% or 30% of oxygen was heat-treated, a film having a very excellent <001> orientation could be obtained.

FIG. 5 shows a graph illustrating changes in specific resistance of a Ru film or a $RuO_2$ film which has been formed taking the oxygen concentration as a parameter during a film-forming process on a Si wafer. It can be seen from FIG. 5 that a Ru film which has been formed without incorporating oxygen at all was turned into $Ru_2Si_3$ after annealing thereof thereby increasing the specific resistance thereof, whereas a Ru film which has been formed with an incorporation of oxygen indicated a decrease in specific resistance upon heat treatment thereof. In particular, a Ru film which has been formed with the oxygen concentration being set to 10% exhibited a specific resistance of 11 $\mu\Omega$cm, which is close to the resistance value of Ru, i.e. 7 $\mu\Omega$cm.

FIG. 6 shows a graph illustrating changes in stress of a Ru film or a $RuO_2$ film which has been formed taking the oxygen concentration as a parameter during a film-forming process on a Si wafer. It can be seen from FIG. 6 that a Ru film which has been formed without incorporating oxygen at all or a $RuO_2$ film which has been formed with an addition of 50% or more of oxygen exhibited a very large compression stress, whereas a Ru film which has been formed with a concentration of 10% and 30% of oxygen indicated a small stress immediately after the formation of film.

A $RuO_2$ film which has been formed with the oxygen concentration being set to 50% or more indicated a tendency that the film could be easily peeled off as the thickness of the film becomes 200 nm or more. On the other hand, a Ru film and a $RuO_2$ film which have been formed with an addition of oxygen indicated a smaller tensile stress as they were heat-treated so that it was possible to obtain an excellent electrode which was free from a problem of peel off of film when these films were heat-treated after the formation of these films.

FIG. 7 shows a graph illustrating changes in thickness estimated as a $SiO_2$ ($SiO_2$-equivalent thickness) of a $Ba_{0.5}Sr_{0.5}TiO_3$ film, which has been determined from the C-V characteristics of the sample, which has been formed according to the following process. Namely, a Ru film or a $RuO_2$ film having a thickness of 200 nm was formed taking the oxygen concentration as a parameter during a film-forming process on an $n^+$-type Si substrate and then heat-treated for one minute in a $N_2$ atmosphere at a temperature of 700° C. Thereafter, a $Ba_{0.5}Sr_{0.5}TiO_3$ film having a thickness of 40 nm was formed on the Ru film or a $RuO_2$ film and then heat-treated for one minute in an oxygen atmosphere at a temperature of 650° C. Finally, a Ru electrode having a thickness of 100 nm was formed on the $Ba_{0.5}Sr_{0.5}TiO_3$ film thereby to obtain the aforementioned sample.

Electric properties of the sample were measured at the interface between the Ru film of the upper electrode and the $n^+$-type diffusion region of the substrate. As seen from the graph shown in FIG. 7, although the sample obtained as the oxygen concentration at the process of film formation was set to 0% indicated a $SiO_2$-reduced film of as thick as 5.2 nm, other samples indicated a relatively thin $SiO_2$ reduced film having a thickness of 2.0 nm or less. In particular, when a Ru film obtained as the oxygen concentration was set to 0% was employed as an electrode, a very thin $SiO_2$-reduced film having a thickness of as thin as 0.36 nm was obtained. In the case of the sample obtained as the oxygen concentration at the process of film formation was set to 0%, a compound of $Ru_2Si_3$ was formed so that $SiO_2$ was caused to formed at an interface between the lower electrode and the $Ba_{0.5}Sr_{0.5}TiO_3$ film, thus increasing the $SiO_2$ equivalent film thickness. On the other hand, in the case of the $RuO_2$ film obtained as the oxygen concentration at the process of film formation was set to 50% or more, SiOx was caused to be formed at an interface between the $n^+$-type Si layer and the $RuO_2$ film. As a result, it was assumed that the $SiO_2$ equivalent film thickness was caused to be increased as compared with those of the samples which have been obtained as the oxygen concentration at the process of film formation was set to less than 50%.

Figure 8A:
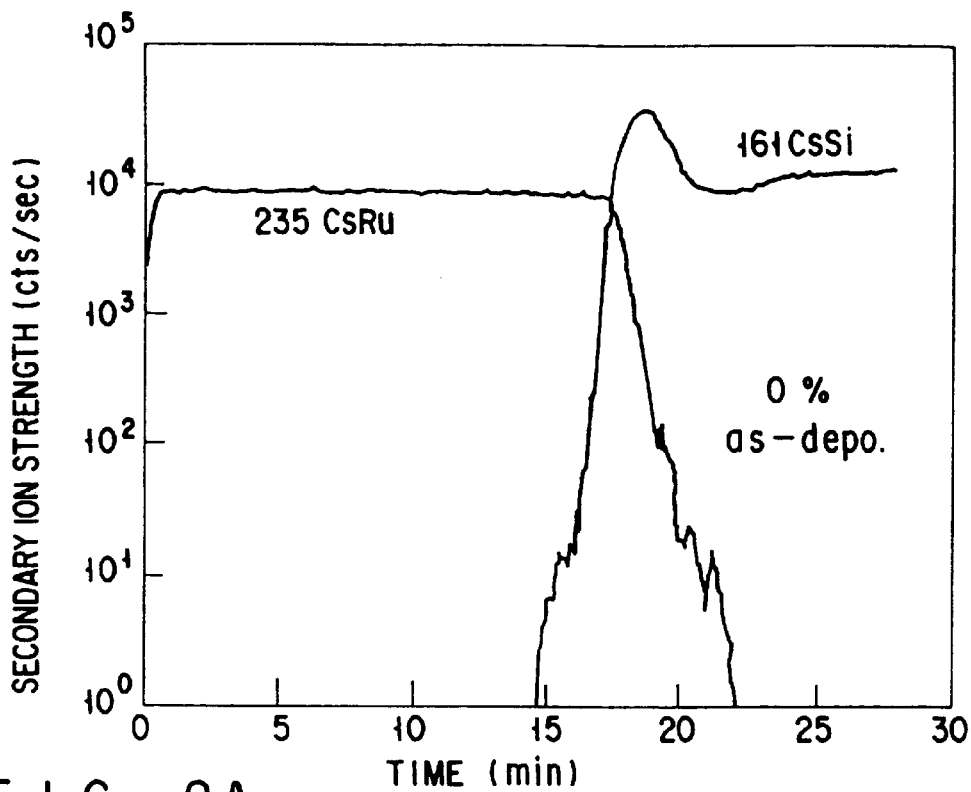
FIGS. 8A to 10B respectively shows an SIMS profile before and after a heat treatment in relative to the concentration of oxygen at the process of forming a film.
Figure 8B:
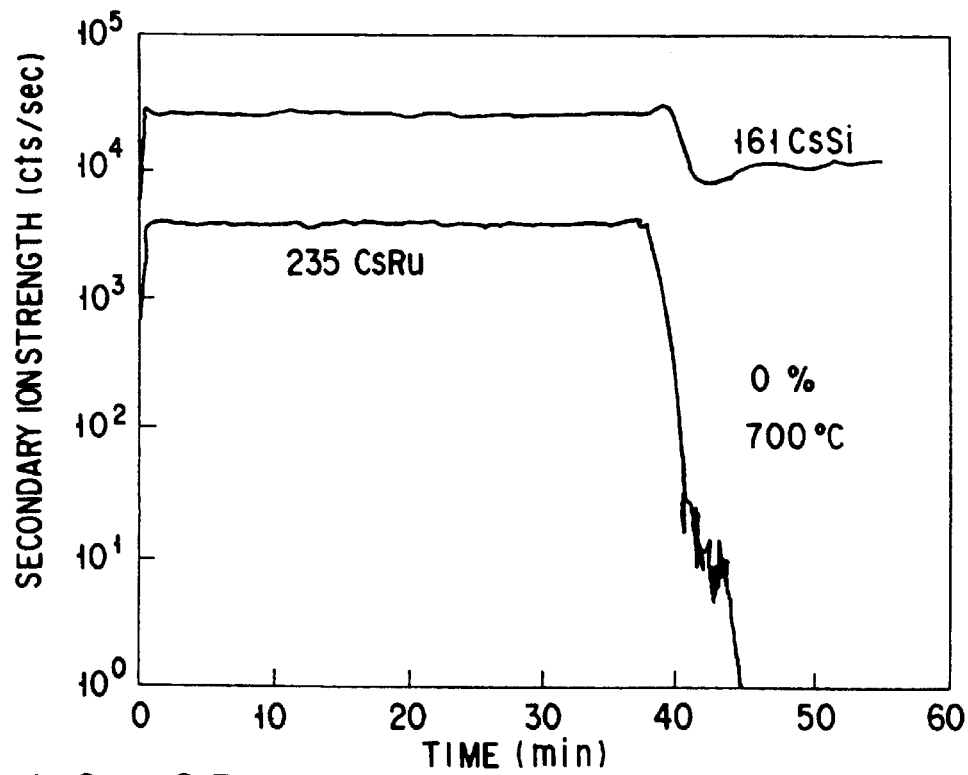
Figure 9A:
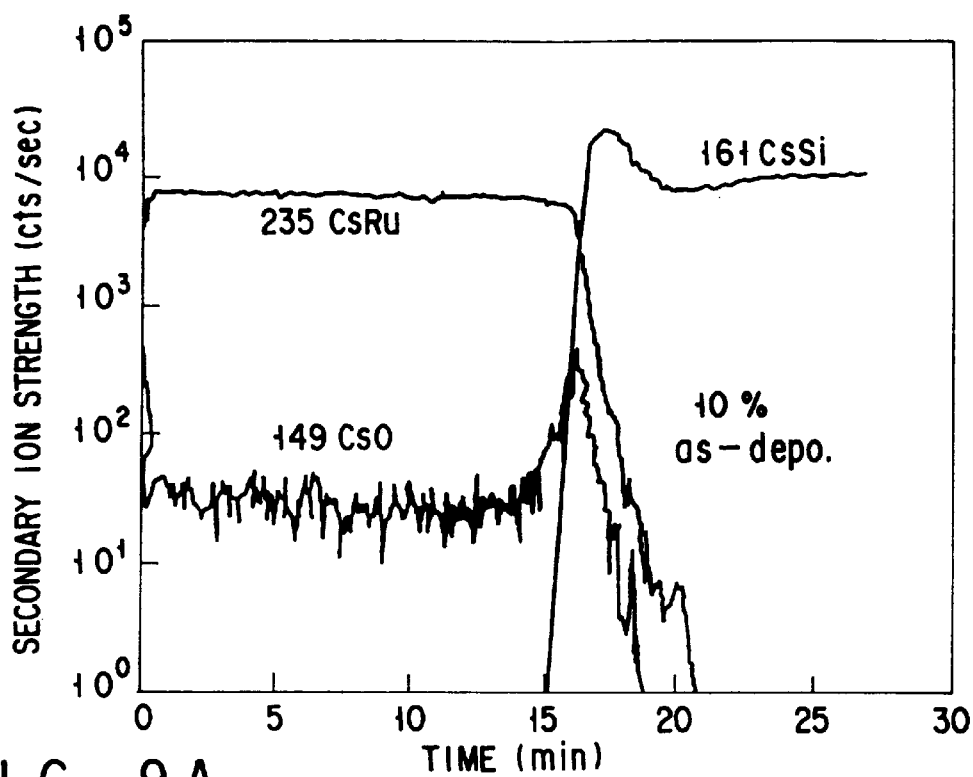
Figure 9B:
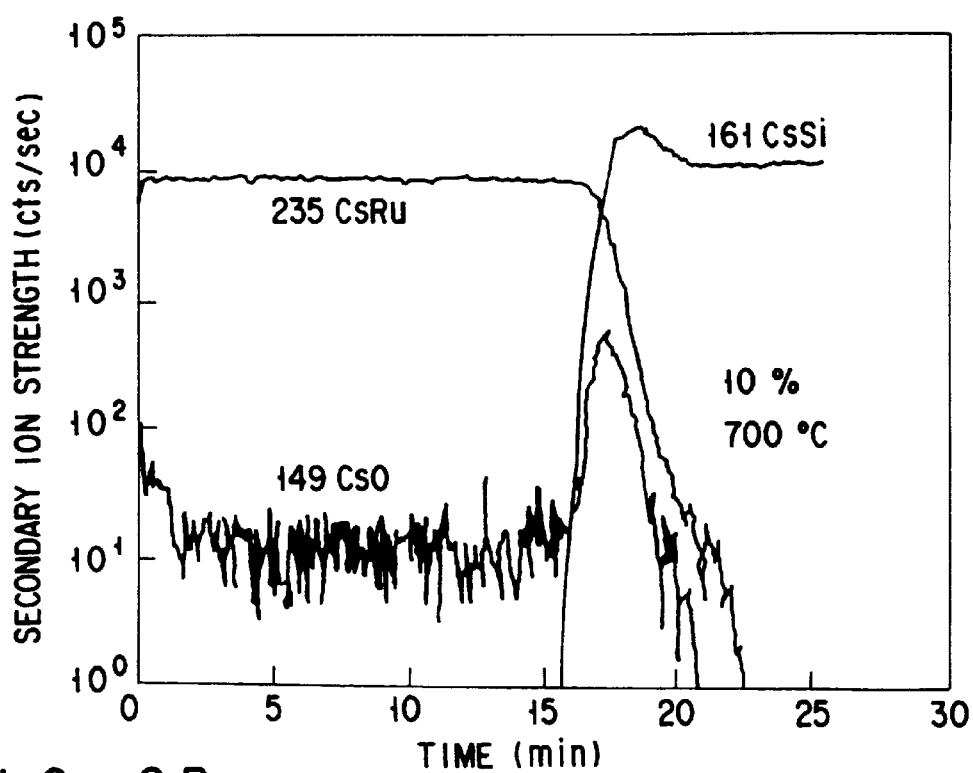
Figure 10A:
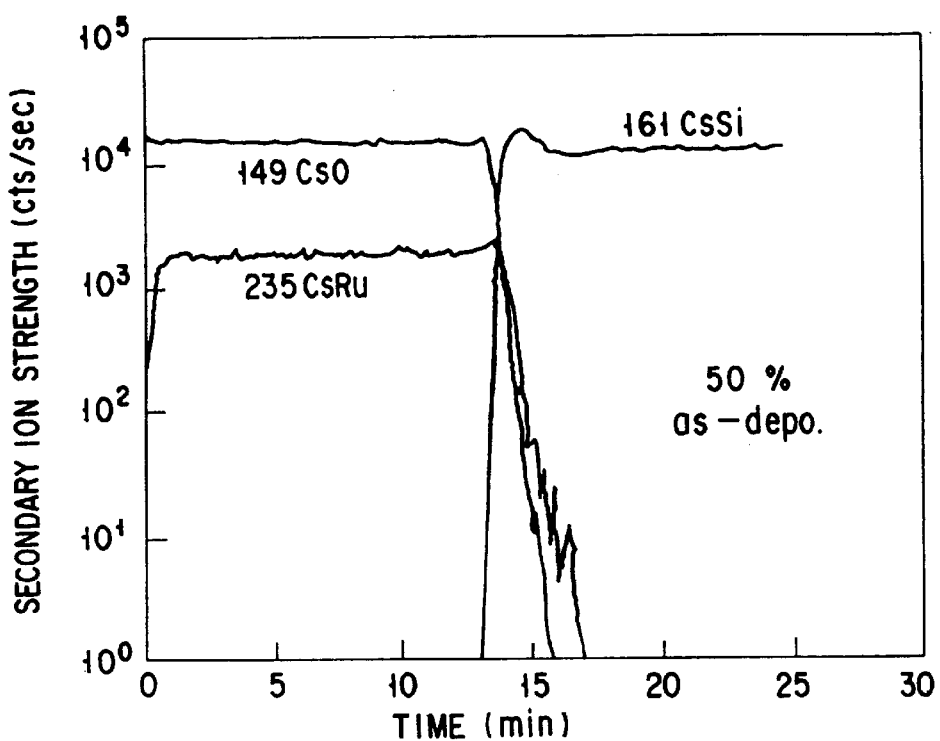
Figure 10B:
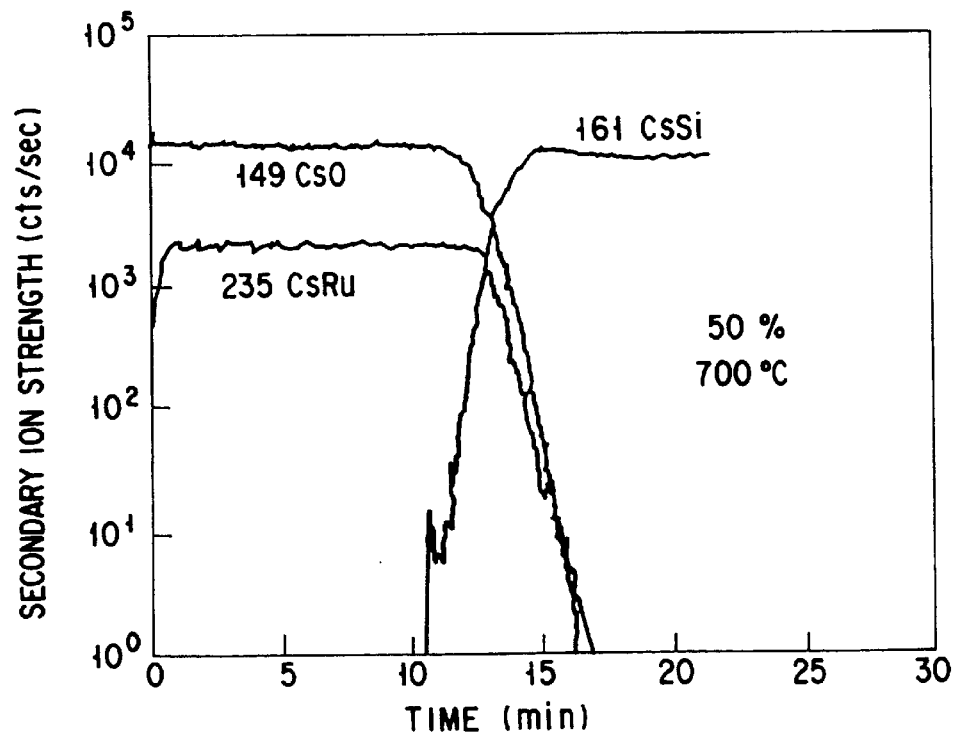

FIGS. 8A to 10B respectively shows an SIMS profile of Ru film which was obtained by way of sputtering and then heat-treated in $N_2$ gas atmosphere for one minute. Namely, FIGS. 8A to 8B respectively shows an SIMS profile when the oxygen concentration at the film forming through sputtering was set to 0%; FIGS. 9A to 9B respectively shows an SIMS profile when the oxygen concentration at the film forming through sputtering was set to 10%; and FIGS. 10A to 10B respectively shows an SIMS profile when the oxygen concentration at the film forming through sputtering was set to 50%. By the way, FIGS. 8A, 9A and 10A illustrate profiles where the heat treatment was not performed at all, while FIGS. 8B, 9B and 10B illustrate profiles where the heat treatment was performed at a temperature of 700° C.

As apparent from these FIGS., in the case of Ru film obtained as the oxygen concentration at the process of film formation was set to 0%, Si was caused to diffuse up to the surface of the Ru film, thereby forming a ruthenium silicide, while in the case of Ru film obtained as the oxygen concentration at the process of film formation was set to 50%, a counter diffusion was caused to occur between Si and Ru after the heat treatment. Whereas, in the case of Ru film obtained as the oxygen concentration at the process of film formation was set to 10%, the counter diffusion was scarcely caused to occur between Si and Ru after the heat treatment.

When the oxygen concentration in the Ru film and the stability of the interface were examined in detail, it has been found that when the oxygen concentration in the Ru film was 0.004% or less, Ru was entirely reacted with Si thereby forming ruthenium silicide, whereas when the oxygen concentration in the Ru film was set to 5% or more, the surface of silicon was oxidized thereby forming a thick silicon oxide film at the interface between Ru and Si. Therefore, it can be seen that the oxygen concentration in the Ru film should be controlled within a range of 0.004 to 5%. It has been found in this case that if the oxygen concentration in the atmosphere during the step of forming the film was controlled to 1 to 40%, a Ru film having the aforementioned oxygen concentration could be obtained.

Due to the effect of the ruthenium film containing the aforementioned concentration of oxygen, a very thin amorphous layer was caused to be formed at an interface between the ruthenium film and the silicon layer so that even if the ruthenium film was subsequently heat-treated, only a very limited quantity of ruthenium was diffused into the silicon layer. Namely, the formation of ruthenium silicide through a reaction between the entire ruthenium and silicon could be inhibited.

As explained above, it is possible, with the employment of an electrode comprising a metallic film (such as ruthenium film) containing extremely small quantities of oxygen according to this invention, to improve the performance of capacitor and to save the manufacturing cost.

Additionally, when a mixed oxide layer is caused to be formed between the metal element constituting the electrode of the capacitor and the underlying silicon between the electrode of capacitor and the underlying silicon (a conductive region on the surface of silicon substrate or silicon plug), a reaction between the electrode and the underlying silicon can be prevented, thus making it possible to produce a capacitor having a high capacity and reliability, which can be applicable to a semiconductor integrated circuit etc. Next, the effects of such a capacitor will be explained below.

If a high dielectric film having a perovskite crystal structure is to be applied to a dielectric film of capacitor so as to enhance the capacitance, the employment of a metallic material belonging to noble metal such as platinum having a very low reactivity, or a metal whose oxide is still conductive such as ruthenium, rhenium, platinum, osmium is seems to be effective so as to prevent a low dielectric layer from being formed at an interface between the electrode and the dielectric film for capacitor. When any of these materials is to be formed on the underlying silicon, a barrier metal (diffusion-preventing layer) is required to be formed between the electrode and the silicon plug so as to prevent the occurrence of a silicide-forming reaction (silicification). Meanwhile, since oxygen can be easily diffused into these metals under a high temperature condition, TiN which is commonly employed as an underlying barrier can be oxidized during a high temperature treatment in an oxygen atmosphere in the step of forming a high dielectric body, thereby deteriorating the characteristics of the capacitor.

By contrast, when the electrode/silicon (polycrystal silicon) interface is interposed by a mixed oxide layer consisting of a metallic element constituting the electrode and silicon, the aforementioned reaction is expected to be prevented and at the same time, the aforementioned problem of oxidation can be avoided as the mixed oxide layer itself is formed of oxides. Since these metal oxides themselves are conductive, the mixed oxide layer is excellent in conductivity. Furthermore, since the mixed oxide layer is mixed with silicon, the diffusion barrier property thereof is also improved. Although an optimum film thickness of such a film may be suitably selected depending on the material, the aforementioned effects can be expected even if the thickness of the film is relatively thin.

This invention will be explained further with reference to the following various examples.

EXAMPLE 1

Figure 11:
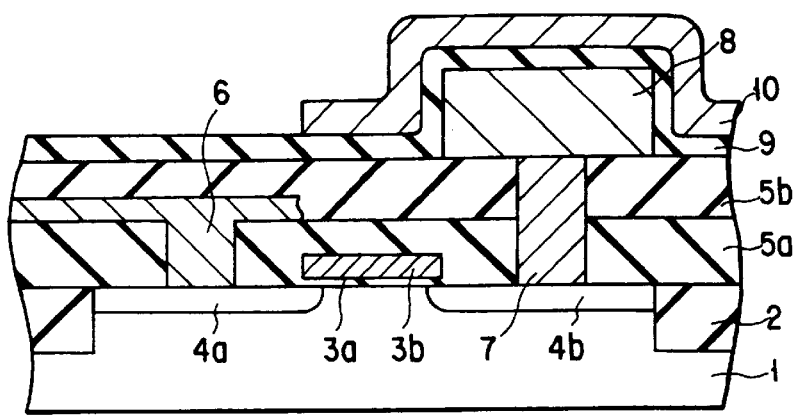
FIG. 11 is a cross-sectional view showing the element structure of a semiconductor device according to a first embodiment of this invention.

FIG. 11 is a cross-sectional view showing the element structure of a semiconductor device according to a first embodiment of this invention.

Referring to FIG. 11, a MOS transistor comprising a gate insulating film 3a, a gate electrode (word line) 3b and a source/drain diffusion region 4; and a capacitor comprising a Ru film 8 as a lower electrode, a $Ba_xSr_{1-x}TiO_3$ film 9 as a capacitor insulating film and a $WN_x$ film 10 as an upper electrode are formed on a p-type silicon substrate 1, thereby constituting a DRAM cell. Reference numeral 2 denotes an element isolation region, 5a and 5b denote respectively an interlayered insulating film, 6 denotes a bit line and 7 denotes an $n^+$-type polycrystal silicon film.

Then, a method of manufacturing a semiconductor device shown in FIG. 11 will be explained with reference to FIGS. 12A to 12C.

Figure 12A:
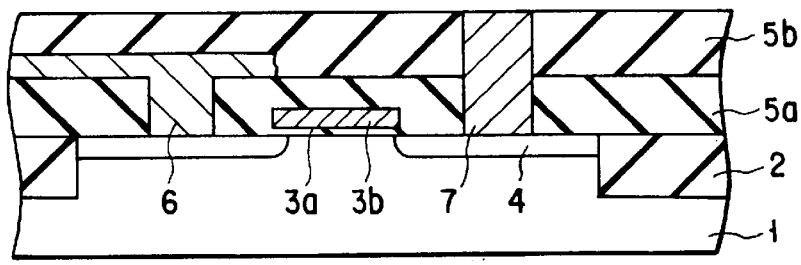
FIGS. 12A to 12C respectively shows a cross-sectional view illustrating a process for manufacturing a semiconductor device of FIG. 11.

As shown in FIG. 12A, the element isolation region 2 was formed on the p-type silicon substrate 1, and then the gate insulating film 3a, the gate electrode 3b and the $n^+$-type diffusion region 4 were successively formed. After depositing the interlayered insulating film 5a all over the surface of the substrate 1, a contact hole was formed in the interlayered insulating film 5a and the bit line 6 was formed through this contact hole. Then, after depositing the interlayered insulating film 5b all over the exposed surfaces of the interlayered insulating film 5a and bit line 6, a contact hole passing through the interlayered insulating films 5a and 5b and communicating with the diffusion region 4 was formed. Subsequently, the $n^+$-type polycrystal silicon film 7 was deposited all over the surface of the interlayered insulating film 5b thereby burying the contact hole with the $n^+$-type polycrystal silicon film 7, and then all of the $n^+$-type polycrystal silicon film 7 deposited on the interlayered insulating film 5b except that in the contact hole was etched away thereby leaving the n+type polycrystal silicon film 7 remained only in the contact hole.

Figure 12B:
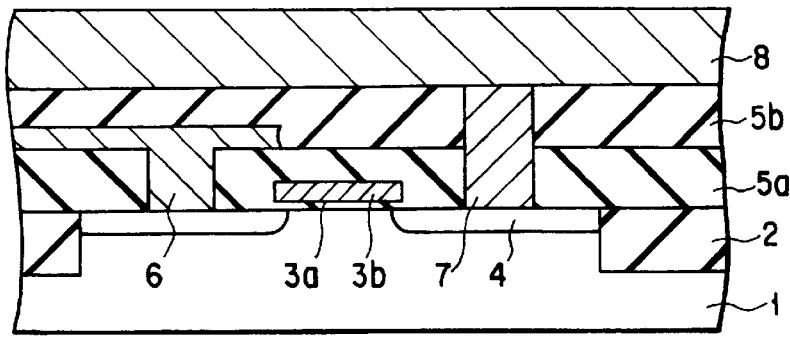
Figure 12C:
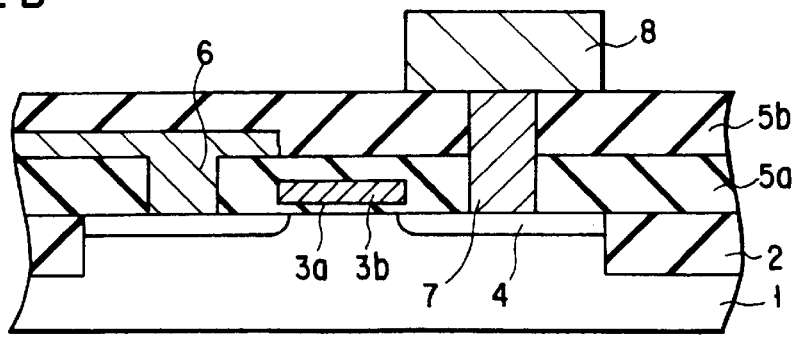

Then, as shown in FIG. 12B, a Ru film 8 was deposited all over the surface of the interlayered insulating film 5b including the portion of the contact hole by way of sputtering in an Ar atmosphere containing 1 to 40% of oxygen. Thereafter, the Ru film 8 was worked so as to make it into a columnar shape as shown in FIG. 12C.

Then, a $Ba_xSr_{1-x}TiO_3$ film 9 was deposited all over the exposed surface and heat-treated in an atmosphere containing oxygen at a temperature of 550 to 800° C. An atmosphere containing nitrogen can be used in this heat treatment. A $WN_x$ film 10 was deposited over the $Ba_xSr_{1-x}TiO_3$ film 9. Thereafter, the $WN_x$ film 10 was worked to form an upper electrode, thereby obtaining a structure shown in FIG. 11.

According to this Example, since the Ru film 8 containing extremely small quantities of oxygen is employed as a capacitor electrode connecting directly with the polycrystal silicon film 7, it is possible to prevent the capacitor electrode from being turned into a silicide without requiring the employment of a diffusion-preventing layer. Moreover, since a diffusion-preventing layer is not employed, there is no probability of increasing the contact resistance through the oxidation of the diffusion-preventing layer.

EXAMPLE 2

Figure 13:
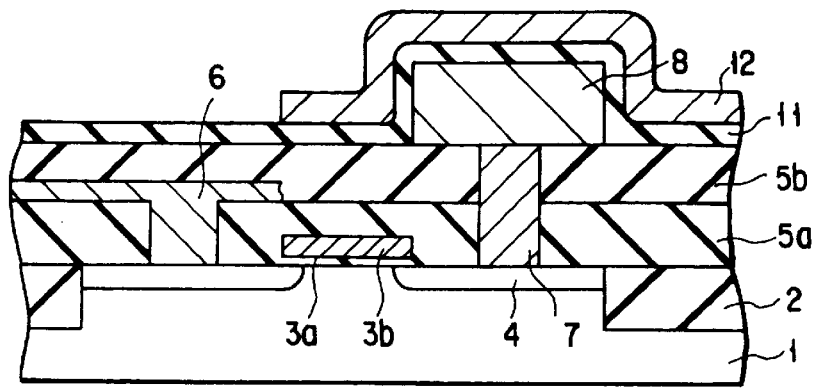
FIG. 13 is a cross-sectional view showing the element structure of a semiconductor device according to a second embodiment of this invention.

FIG. 13 is a cross-sectional view showing the element structure of a semiconductor device according to a second embodiment of this invention.

The same procedures as Example 1 were repeated up to the step of depositing the Ru film 8 all over the exposed upper surface of the device. Then, the Ru film 8 was heat-treated in a $N_2$ atmosphere at a temperature of 450 to 800° C., and the Ru film 8 was worked so as to make it into a columnar shape. Then, a $SrTiO_3$ film 11 was deposited and heat-treated in an atmosphere containing oxygen at a temperature of 500 to 800° C. An atmosphere containing nitrogen can be used in this heat treatment. A Ni film 12 was deposited over the $SrTiO_3$ film 11. Thereafter, the Ni film 12 was worked to form an upper electrode.

This Example differs from that of Example 1 in that according to this Example, a high dielectric film was formed after the heat treatment of the Ru film 8 formed in advance in an oxygen-containing atmosphere. If the Ru film 8 is heat-treated in this manner, a film having <001> orientation can be obtained so that the crystallinity after heat treatment of the high dielectric film can be improved thereby making it possible to obtain a high dielectric constant.

EXAMPLE 3

Figure 14:
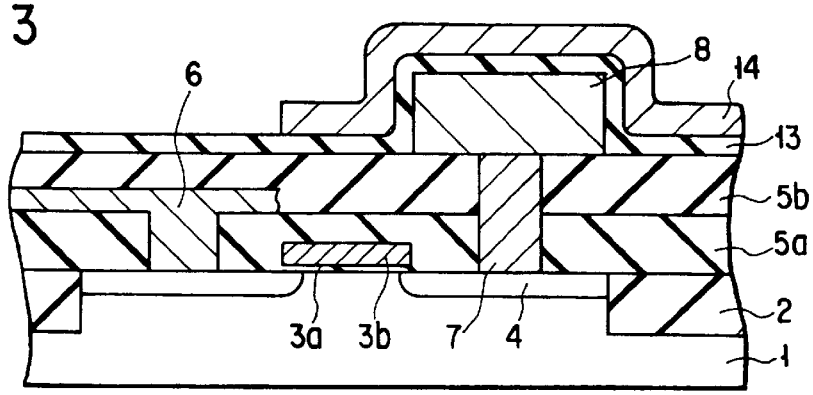
FIG. 14 is a cross-sectional view showing the element structure of a semiconductor device according to a third embodiment of this invention.

FIG. 14 is a cross-sectional view showing the element structure of a semiconductor device according to a third embodiment of this invention.

The same procedures as Example 1 were repeated up to the step of depositing the Ru film 8 all over the exposed upper surface of the device. Then, the Ru film 8 was worked so as to make it into a columnar shape and then the Ru film B of columnar shape was heat-treated in a $N_2$ atmosphere at a temperature of 450 to 800° C. Then, a $Ta_2O_5$ film 13 functioning as a capacitor insulating film was deposited and heat-treated in an atmosphere containing oxygen at a temperature of 680 to 800° C., followed by a further heat treatment in an oxygen plasma at a temperature of 300 to 450° C. Thereafter, TiN film 14 was deposited over the $Ta_2O_5$ film 13 and worked so as to form an upper electrode.

This Example differs from those of Examples 1 and 2 in that according to this Example, the heat treatment of the Ru film 8 formed in an oxygen-containing atmosphere was preceded by the working of the Ru film 8 to form a columnar shape. If the Ru film 8 is heat-treated in this manner, a film having an upper surface constituted by (001) crystal face and side surfaces constituted by a (001) crystal face, a (110) crystal face, a (1-10) crystal face, a (-110) crystal face and a (-1-10) crystal face can be obtained so that the crystallinity after heat treatment of the high dielectric film at the upper surface and side surfaces of the storage node can be improved thereby making it possible to obtain a high capacitance.

EXAMPLE 4

Figure 15A:
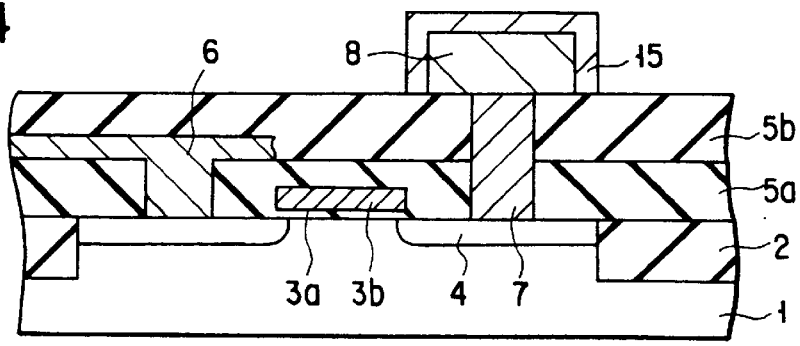
FIGS. 15A and 15B respectively shows a cross-sectional view illustrating a process for manufacturing a semiconductor device of a fourth embodiment of this invention.
Figure 15B:
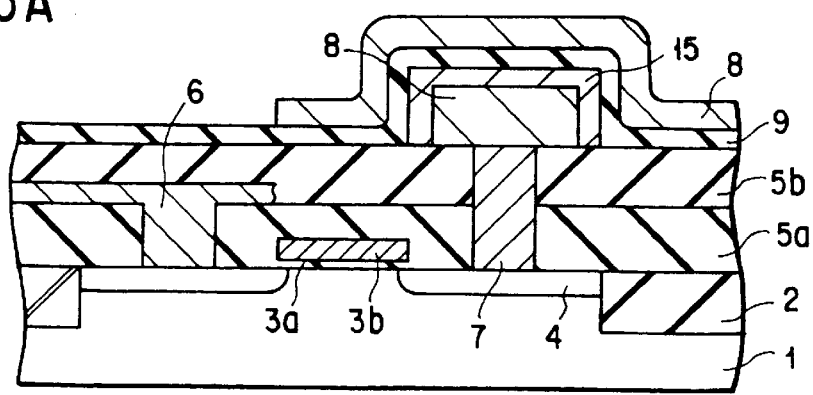

FIGS. 15A and 15B respectively shows a cross-sectional view illustrating a process for manufacturing a semiconductor device of a fourth embodiment of this invention.

The same procedures as Example 1 were repeated up to the step of burying the n$^+$ type polycrystal Si film in the contact hole. Then, the Ru film 8 was deposited all over the exposed upper surface in an argon atmosphere containing 1 to 40% of oxygen, and then worked so as to obtain a columnar shape of the Ru film 8 as shown in FIG. 15A. Subsequently, this columnar Ru film 8 was heat-treated in an atmosphere containing oxygen at a temperature of 500 to 800° C., thereby forming a thin $RuO_2$ film 15.

Then, as shown in FIG. 15B, a $Ba_xSr_{1-x}TiO_3$ film 9 was deposited all over the upper surface of the device including the surface of the thin $RuO_2$ film 15, and thereafter heat-treated in a nitrogen gas atmosphere or in an inert gas atmosphere at a temperature of 650 to 800° C., followed by a further heat treatment thereof in an oxygen atmosphere at a temperature of 200 to 600° C. Subsequently, another Ru film 8 was deposited in an oxygen-containing atmosphere and worked to form an upper electrode.

EXAMPLE 5

Figure 16A:
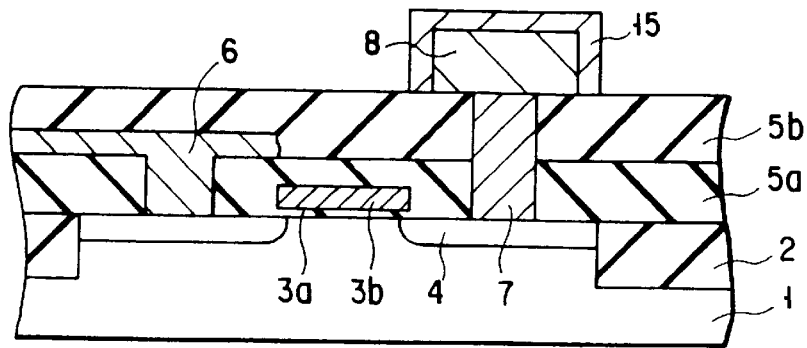
FIGS. 16A and 16B respectively shows a cross-sectional view illustrating a process for manufacturing a semiconductor device of a fifth embodiment of this invention.
Figure 16B:
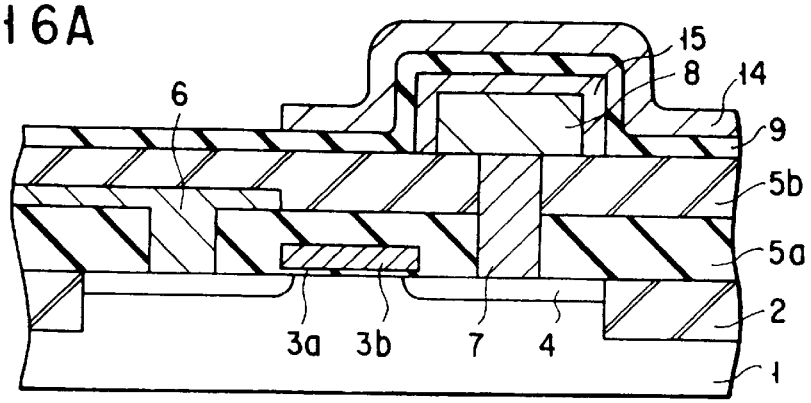

FIGS. 16A and 16B respectively shows a cross-sectional view illustrating a process for manufacturing a semiconductor device of a fifth embodiment of this invention.

The same procedures as Example 1 were repeated up to the step of burying the n$^+$ type polycrystal Si film in the contact hole. Then, the Ru film 8 was deposited by means of sputtering all over the exposed upper surface in an argon atmosphere containing 10% of oxygen as shown in FIG. 16A. After the heat treatment of the Ru film 8 in a $N_2$ atmosphere at a temperature of 450 to 800° C., the Ru film 8 was worked so as to obtain a columnar shape of the Ru film 8. Subsequently, this columnar Ru film 8 was heat-treated in an atmosphere containing oxygen at a temperature of 500 to 800° C., thereby forming a $RuO_2$ film 15 on the surface of the Ru film 8.

Then, as shown in FIG. 16B, a $Ba_xSr_{1-x}TiO_3$ film 9 was deposited all over the upper surface of the device including the surface of the thin $RuO_2$ film 15, and thereafter heat-treated in an oxygen-containing atmosphere at a temperature of 550 to 800° C., and then a TiN film 14 was deposited and worked to form an upper electrode constituted by the TiN film 14.

EXAMPLE 6

Figure 17A:
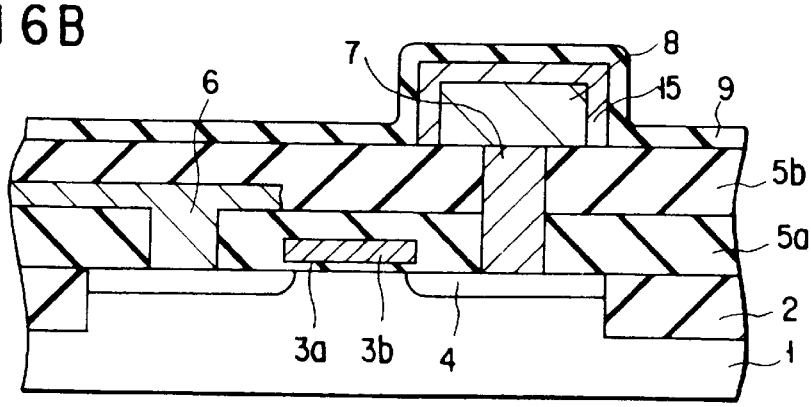
FIGS. 17A and 17B respectively shows a cross-sectional view illustrating a process for manufacturing a semiconductor device of a sixth embodiment of this invention.
Figure 17B:
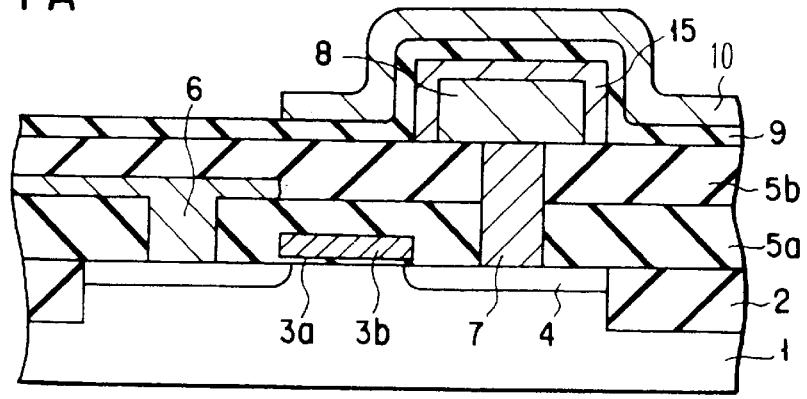

FIGS. 17A and 17B respectively shows a cross-sectional view illustrating a process for manufacturing a semiconductor device of a sixth embodiment of this invention.

The same procedures as Example 1 were repeated up to the step of burying the n$^+$ type polycrystal Si film in the contact hole. Then, as shown in FIG. 17A, the Ru film 8 was deposited by means of sputtering all over the exposed upper surface in an argon atmosphere containing 10% of oxygen. After the heat treatment of the Ru film 8 in a $N_2$ atmosphere at a temperature of 450 to 800° C., the Ru film 8 was worked so as to obtain a columnar shape of the Ru film 8. Subsequently, a $Ba_xSr_{1-x}TiO_3$ film 9 was deposited all over the upper surface of the device and heat-treated in an atmosphere containing oxygen at a temperature of 500 to 800° C., thereby forming a $RuO_2$ film 15 at an interface between the Ru film 8 and the $Ba_xSr_{1-x}TiO_3$ film 9.

Then, as shown in FIG. 17B, a $WN_x$ film 10 was deposited and worked to form an upper electrode constituted by the $WN_x$ film 10.

EXAMPLE 7

FIGS. 18A to 18F respectively shows a cross-sectional view illustrating a process for manufacturing a semiconductor device of a seventh embodiment of this invention.

Figure 18A:
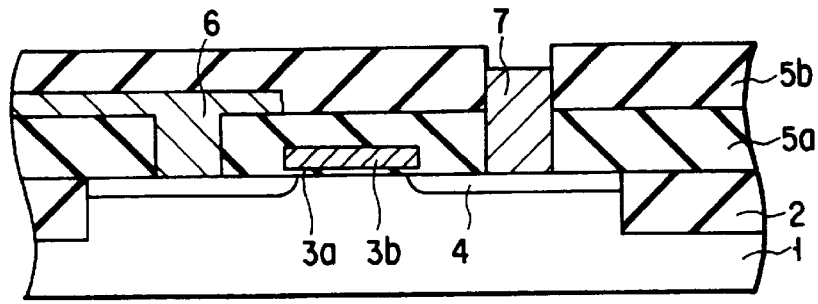
FIGS. 18A to 18F respectively shows a cross-sectional view illustrating a process for manufacturing a semiconductor device of a seventh embodiment of this invention.

As shown in FIG. 18A, the element isolation region 2 was formed on the p-type silicon substrate 1, and then the gate insulating film 3a, the gate electrode (word line) 3b and the n$^+$-type diffusion region 4 were successively formed. After depositing the interlayered insulating film 5a all over the surface of the substrate 1, a contact hole was formed in the interlayered insulating film 5a and the bit line 6 was formed through this contact hole. Then, after depositing the interlayered insulating film 5b all over the exposed surfaces of the interlayered insulating film 5a and bit line 6, a contact hole passing through the interlayered insulating films 5a and 5b and communicating with the diffusion region 4 was formed. Subsequently, the $n^+$-type polycrystal silicon film 7 was deposited all over the surface of the interlayered insulating film 5b thereby burying the contact hole with the $n^+$-type polycrystal silicon film 7, and then all of the $n^+$-type polycrystal silicon film 7 deposited on the interlayered insulating film 5b except that in the contact hole was etched away thereby leaving the $n^+$-type polycrystal silicon film 7 remained only in the contact hole. In this case, the etching of the $n^+$-type polycrystal silicon film 7 was performed such that the contact hole was not completely filled with the $n^+$-type polycrystal silicon film 7, but the upper portion of the contact hole was kept vacant of the $n^+$-type polycrystal silicon film 7.

Figure 18B:
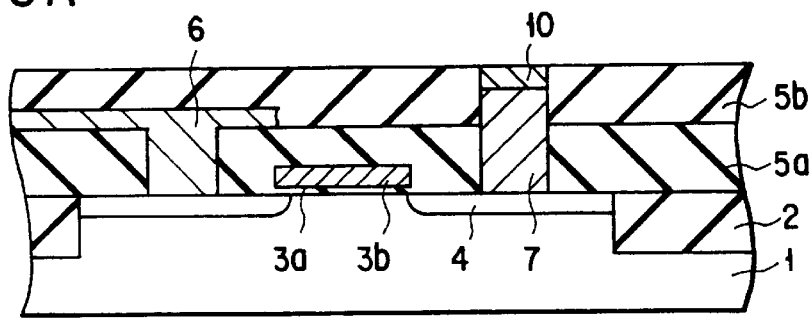
Figure 18C:
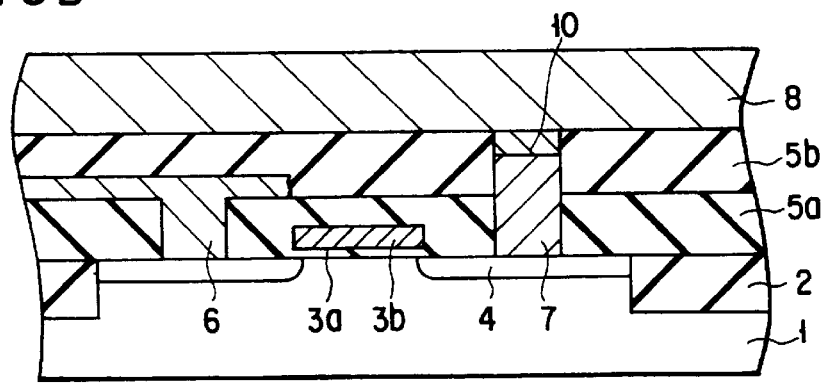

Then, as shown in FIG. 18B, a $WN_x$ film 10 was deposited all over the surface of the device and then heat-treated in a NH3 atmosphere at a temperature of 500 to 800° C. Thereafter, the $WN_x$ film 10 was partially removed by means of a mechanical polishing or an etch-back, leaving it only in the contact hole. Then, a Ru film 8 was deposited all over the resultant device by means of sputtering in an argon atmosphere containing 10% of oxygen as shown in FIG. 18C. In this case, the $WN_x$ film 10 constituting a diffusion-preventing film was not exposed after the formation of the Ru film 8 constituting a capacitor electrode, so that the diffusion-preventing film would never be oxidized. Moreover, since the quantity of oxygen contained in the Ru film 8 is very small as in the case of the aforementioned Examples, the quantity of the $WN_x$ film 10 that would be oxidized can be extremely restricted to extremely small quantities.

Since the Ru film containing extremely small quantities of oxygen was formed on the $WN_x$ film 10 in this case, it is possible to alleviate a stress between the $WN_x$ film 10 and the Ru film 8, thus overcoming the problem of the peel-off of the Ru film 8.

Figure 18D:
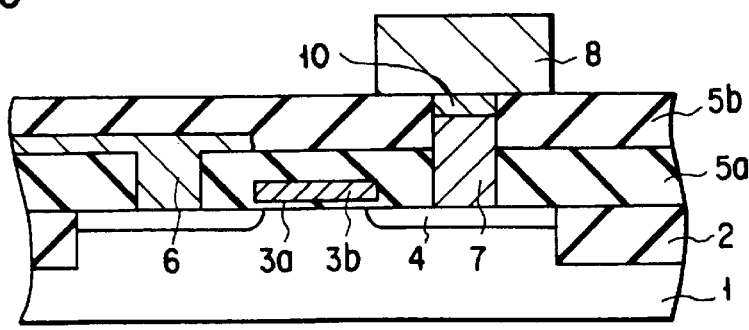
Figure 18E:
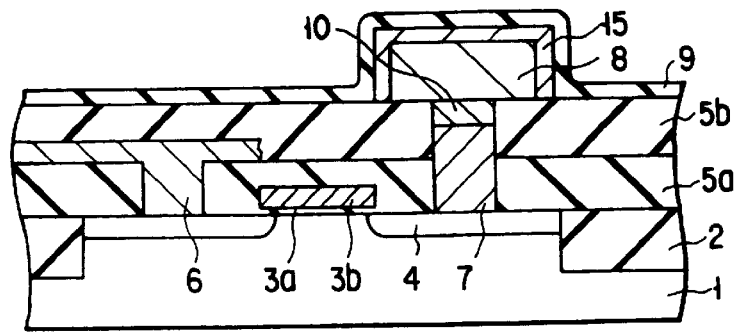

After being heat-treated in a $N_2$ gas atmosphere at a temperature of 450 to 800° C., the Ru film 8 was worked so as to form a columnar Ru film 8 as shown in FIG. 18D. Then, as shown in FIG. 18E, a $Ba_xSr_{1-x}TiO_3$ film 9 was deposited all over the exposed surface and heat-treated in an atmosphere containing oxygen at a temperature of 500 to 800° C., thereby forming a $RuO_2$ film 15 at an interface between the Ru film 8 and the $Ba_xSr_{1-x}TiO_3$ film 9.

Figure 18F:
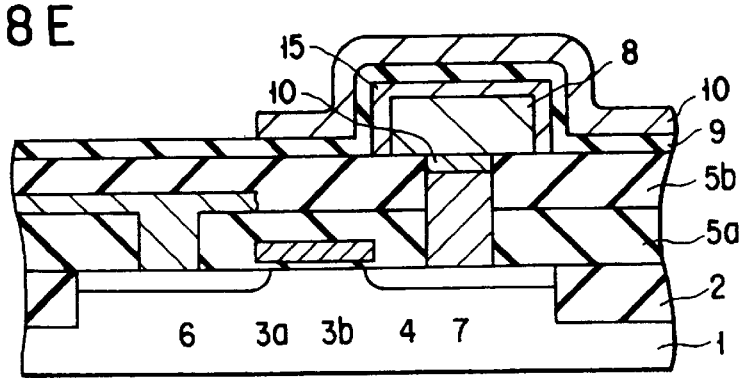

Then, as shown in FIG. 18F, a $WN_x$ film 10 was deposited and worked to form an upper electrode constituted by the $WN_x$ film 10.

EXAMPLE 8

FIGS. 19A to 19F respectively shows a cross-sectional view illustrating a process for manufacturing a semiconductor device of an eighth embodiment of this invention.

Figure 19A:
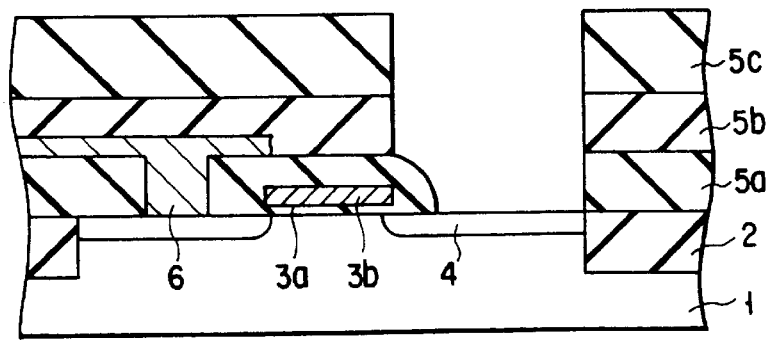
FIGS. 19A to 19F respectively shows a cross-sectional view illustrating a process for manufacturing a semiconductor device of an eighth embodiment of this invention.

As shown in FIG. 19A, the element isolation region 2 was formed on the p-type silicon substrate 1, and then the gate insulating film 3a, the gate electrode (word line) 3b and the $n^+$-type diffusion region 4 were successively formed. After depositing the interlayered insulating film 5a all over the surface of the substrate 1, a contact hole was formed in the interlayered insulating film 5a and the bit line 6 was formed through this contact hole. Then, after depositing the interlayered insulating films 5b and 5c all over the exposed surfaces of the interlayered insulating film 5a and bit line 6, a contact hole passing through the interlayered insulating films 5a, 5b and 5c and communicating with the diffusion region 4 was formed.

Figure 19B:
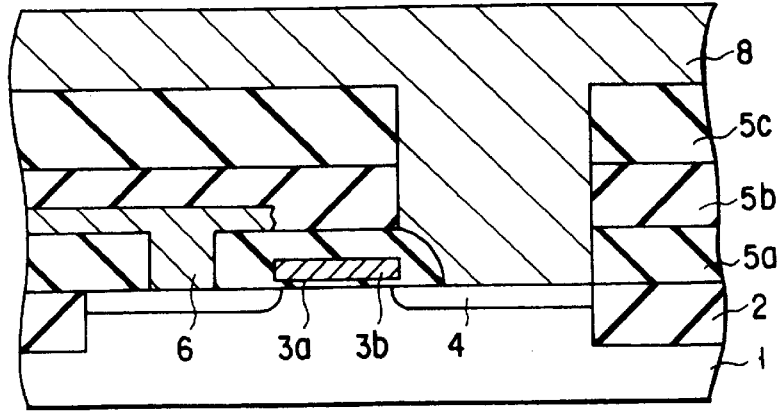
Figure 19C:
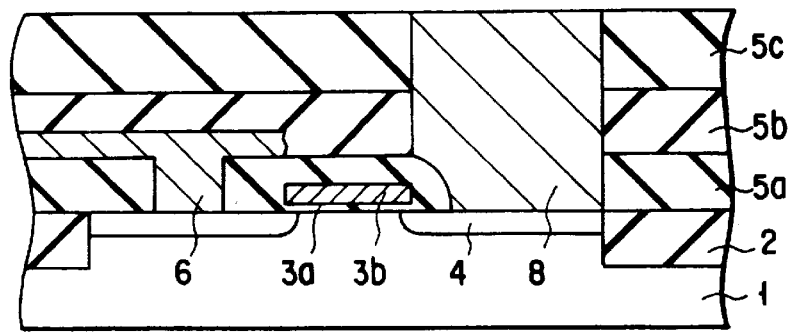

Subsequently, as shown in FIG. 19B, another Ru film 8 was deposited by means of a CVD method in a $H_2$ atmosphere containing 40% of oxygen all over the surface of the interlayered insulating film 5c thereby burying the contact hole with the Ru film 8, and then heat-treated in a $N_2$ atmosphere at a temperature of 450 to 800° C. Thereafter, the Ru film 8 on the interlayered insulating film 5c was removed as shown in FIG. 19C.

Figure 19D:
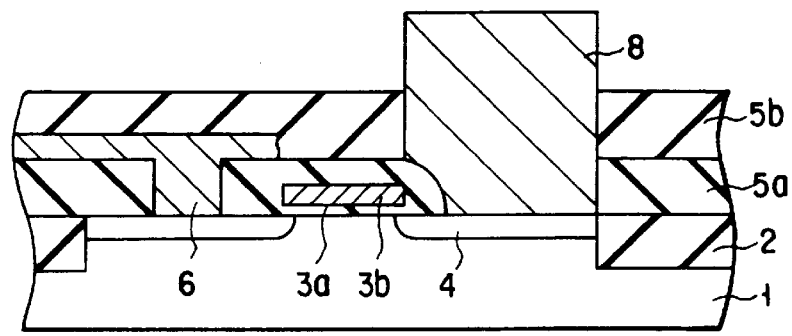
Figure 19E:
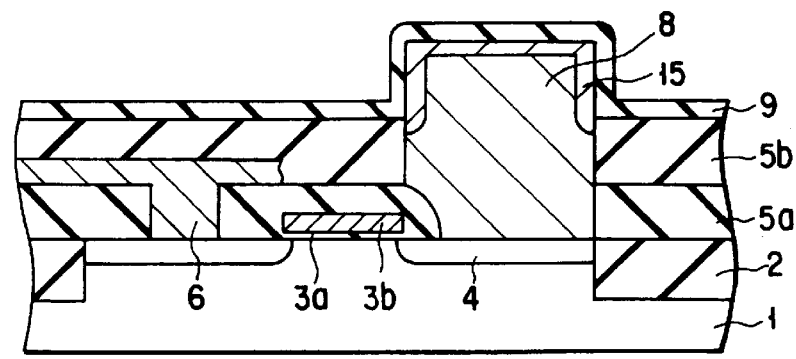

Then, as shown in FIG. 19D, the interlayered insulating film 5c was removed. Then, as shown in FIG. 19E, a $Ba_xSr_{1-x}TiO_3$ film 9 was deposited all over the exposed surface and heat-treated in an atmosphere containing oxygen at a temperature of 500 to 800° C., thereby forming a $RuO_2$ film 15 at an interface between the Ru film 8 and the $Ba_xSr_{1-x}TiO_3$ film 9.

Figure 19F:
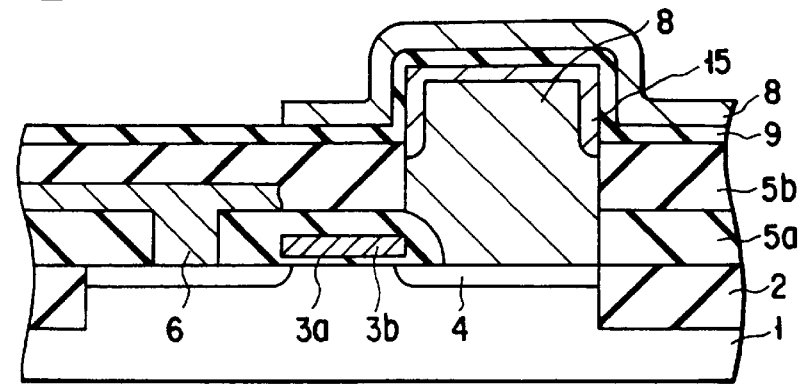

Then, as shown in FIG. 19F, another Ru film 8 was again deposited all over the surface of the $Ba_xSr_{1-x}TiO_3$ film 9 and worked to form an upper electrode constituted by the Ru film 8.

In this Example, $Ru_3(CO)_{12}$ was employed as a raw material for a CVD of the Ru film 8. However, it is possible to employ other kinds of organic material such as $Ru(C_5H_5)_2$ or $Ru(C_5H_7O_2)_3$ for forming a Ru film containing extremely small quantities of oxygen.

EXAMPLE 9

Figure 20A:
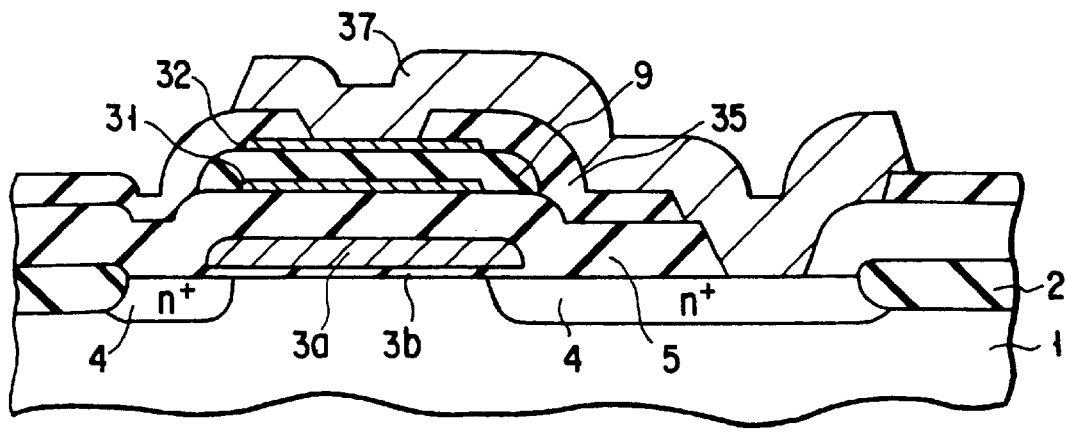
FIG. 20A shows a cross-sectional view illustrating an element structure of a semiconductor device according to a ninth embodiment of this invention.
Figure 20B:
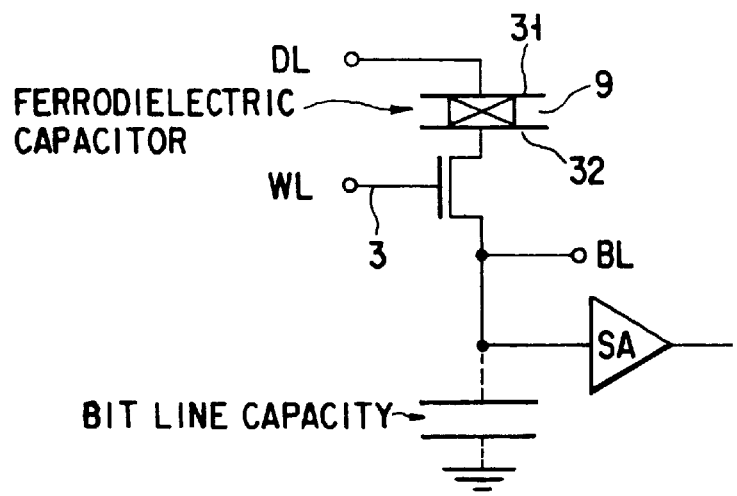
FIG. 20B shows an equivalent circuit illustrating an element structure of a semiconductor device of FIG. 20A.

In the above Examples, this invention has been explained as it is applied to the manufacture of a DRAM cell. However, this invention can also be applied to the manufacture of a ferroelectric random access memory cell. FIG. 20A shows a cross-sectional view illustrating an element structure of a semiconductor device according to a ninth embodiment of this invention which is applied to the manufacture of a ferroelectric random access memory cell. FIG. 20B shows an equivalent circuit illustrating an element structure of a semiconductor device of FIG. 20A.

Referring to FIG. 20A, a MOS transistor comprising a gate insulating film 3a, a gate electrode (word line) 3b and a source/drain diffusion region 4; and a capacitor comprising a $WN_x$ film 31 as a lower electrode, a $Ba_xSr_{1-x}TiO_3$ film 9 as a capacitor insulating film and a Ru film 32 as an upper electrode were formed on a p-type silicon substrate 1, thereby constituting a FRAM cell.

The Ru film 32 constituting the upper electrode contained extremely small quantities of oxygen and was formed by means of a sputtering method in an argon atmosphere containing 1 to 40% of oxygen as in the case of Example 1. This Ru film 32 was connected with a diffusion region 4 via a polycrystal silicon layer 37 which was formed on the surface of an interlayered insulating film 35 disposed over the capacitor portion.

In this structure, the lower electrode 31 of the capacitor is formed over the insulating film 5. However, the upper electrode 32 is directly contacted with the polycrystal silicon 37. Therefore, when the Ru film 32 containing extremely small quantities of oxygen is employed as an upper electrode of a capacitor, the formation of a silicide of the upper electrode 32 can be effectively prevented without necessitating a provision of a diffusion-preventive layer.

The reason for using a Ru film containing extremely small quantities of oxygen for the upper electrode is that the upper electrode is contacted with a polycrystal Si layer. Accordingly, if the lower electrode is contacted with the polycrystal Si layer, the Ru film containing extremely small quantities of oxygen will naturally be used for the lower electrode.

As explained above with reference to the above Examples, it is possible according to this invention to form a capacitor and hence a semiconductor device having an excellent property without employing a diffusion-preventing film, since a silicification of a conductive film can be avoided by the employment of a conductive film containing extremely small quantities of oxygen even if the conductive film is directly in contact with a Si buried in a storage node contact or with an impurity diffusion region of a Si substrate. At the same time, since the formation and working of a diffusion-preventing film can be omitted, the cost for manufacturing a semiconductor device can be reduced.

This invention is not limited to the above Examples. For example, although an $n^+$-type polycrystal silicon film or an $n^+$-type diffusion region was employed as an underlying layer in the above Examples, a $p^+$-type polycrystal silicon film may be formed likewise as an underlying layer on a $p^+$-type diffusion region or on an $n^+$-type diffusion region provided with a diffusion barrier layer. Further, a $Ba_xSr_{1-x}TiO_3$ film, a $Ta_2O_5$ film or a $SrTiO_3$ film was employed as a high dielectric constant insulating film in the above examples, a ferroelectric substance such as a $PbZr_xTi_{1-x}O_3$ film or a $Pb_xLa_{1-x}Zr_yTi_{1-y}O_3$ film may be employed likewise. Furthermore, this invention is not restricted to a memory such as dynamic random access memory or ferroelectric random access memory, but can be applied to various semiconductor devices comprising a high dielectric capacitor.

In the above Examples, $WN_x$ film, Ni film, TiN film or Ru film was employed as an upper electrode. However, it is also possible in this invention to employ other kinds of film as an upper electrode. Further, in the above Examples, only the upper electrode was worked in the preparation of a capacitor, the high dielectric insulating film may be worked concurrently with the working of the upper electrode.

The fundamental feature of this invention resides in that the silicification of capacitor electrode is prevented without making use of a diffusion-preventing film. However, this invention can be carried out even in a case where a diffusion-preventing film is formed on the interior of a contact hole as shown in the aforementioned seventh embodiment. In this seventh embodiment, a $WN_x$ film was employed as a diffusion-preventing film. However, a metallic nitride film such as TiN film, a metallic silicide film such as $WSi_x$ or $TiSi_2$, or a nitride film of a metallic silicide such as $WSi_xN_y$ film or $TiSi_xN_y$ film may be employed likewise.

The following Examples 10 to 12 illustrate examples where a mixed oxide film is interposed between the silicon layer and a conductive material film constituting an electrode.

EXAMPLE 10

Example 10 illustrates where this invention is applied to a dynamic random access memory. FIGS. 21A to 21D illustrate the procedures of manufacturing the dynamic random access memory wherein Ru was employed as a lower electrode of a capacitor in a memory cell where a capacitor is disposed at a location higher than any of the switching transistor, the word line and the bit line.

Figure 21A:
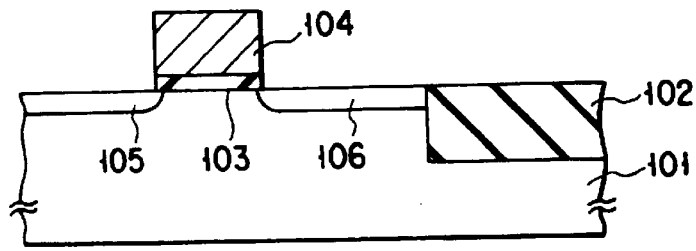
FIGS. 21A to 21D respectively shows a cross-sectional view illustrating a process for manufacturing a semiconductor device of a tenth embodiment of this invention.

As shown in FIG. 21A, a predetermined surface portion of a p-type monocrystalline silicon substrate 101 having (100) crystal face and a specific resistance of 10 Ωcm was removed through etching thereby forming a hole in which an element isolation insulating film 102 was subsequently filled so as to form an element isolation region. Alternatively, this element isolation region may also be formed by making use of the conventional LOCOS method.

Then, a silicon oxide film 103 having a thickness of 10 nm for constituting a gate insulating film was formed by way of a thermal oxidation, and a tungsten silicide film 104 for constituting a gate electrode was deposited thereon. These films were patterned by means of a photolithography and a reactive ion etching to form a gate insulating electrode 103 and a gate electrode 104. Subsequently, an ion implantation was performed with this gate electrode 104 being used as a mask thereby forming in a self-aligned manner a source/drain region constituted by $n^-$-type diffusion regions 105 and 106, thus forming a metal oxide semiconductor field effect transistor as a switching transistor.

Figure 21B:
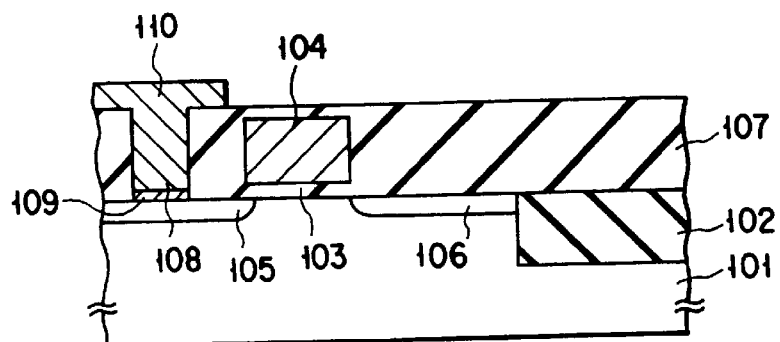

Then, as shown in FIG. 21B, silicon oxide film 107 was deposited by means of a CVD method to a thickness of 100 nm all over the upper surface of the MOSFET, and a contact hole 108 was formed by way of photolithography and reactive ion etching. Then, a titanium silicide film 109 was formed selectively on the bottom of the contact hole 108 and a W film 110 was deposited all over the upper surface of the device. Thereafter, the W film 110 was patterned by making use of photolithography and reactive ion etching, thus concurrently forming a bit line.

Figure 21C:
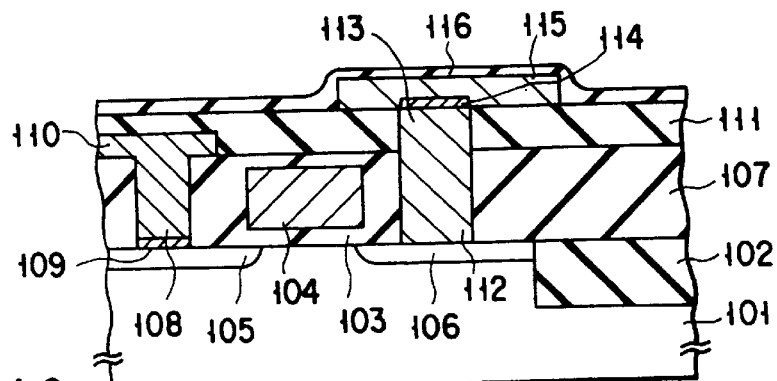

Then, after a CVD oxide film 111 was deposited as shown in FIG. 21C, the resultant surface was flattened. A contact hole 112 was then formed by way of photolithography, and an $n^+$-type polycrystal silicon film 113 was deposited all over the resultant upper surface. Thereafter, the $n^+$-type polycrystal silicon film 113 was left only in the contact hole by making use of a flattening method such as an etch-back, thus forming the $n^+$-type polycrystal silicon film 113 contacting with the $n^-$-type diffusion region 106. Subsequently, a Ru film 115 containing extremely small quantities of oxygen was formed via sputtering in an atmosphere containing small quantities of oxygen. In this case, the concentration of oxygen in the Ru film should preferably be 0.004 to 5%, more preferably 0.01 to 1%.

The resultant device was then subjected to a heat treatment at a temperature of 400° C. or more thereby forming a thin mixed oxide film 114 comprising Si and Ru at an interface between the $n^+$-type polycrystal silicon film 113 and the Ru film 115. The thickness of the mixed oxide film 114 in this case should preferably be 1 nm to 10 nm. Thereafter, the Ru film 115 was worked by way of a reactive ion etching (RIE) in an atmosphere containing oxygen plasma. Then, a $(Ba,Sr)TiO_3$ film 116 having a film thickness of 20 nm was deposited all over the resultant surface by means of a CVD method.

Figure 21D:
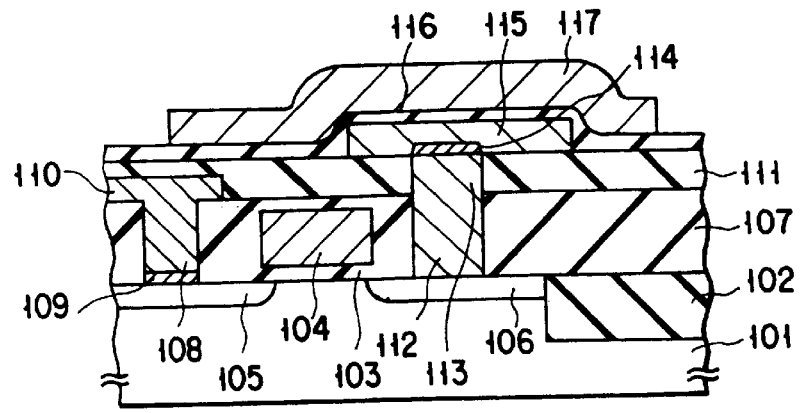

Then, as shown in FIG. 21D, a Ru film 117 for constituting an upper electrode (plate electrode) was formed to complete the manufacture of the cell of dynamic random access memory. Thereafter, the ordinary procedures for completing the dynamic random access memory, such as a step of forming Al wirings were carried out, though drawings for these steps are omitted herein.

In this Example, Ru was employed as a lower electrode for the capacitor, but other materials may also be employed in this invention. For example, Pt, Pd, Ir and Re which are capable of exhibiting conductivity even in the form of oxide thereof as in the case of Ru may be employed. The conductivity of these materials can be maintained even if they are in the form of a mixed oxide film with Si, and hence this mixed oxide layer effectively functions to prevent the metal electrode from reacting with the Si plug.

Further, although a (Ba,Sr)TiO$_3$ film was employed as a capacitor dielectric film in this Example, other materials such as SrTiO$_3$, BaTiO$_3$, CaTiO$_3$, PbTiO$_3$, PZT, etc. may be employed in place of the (Ba,Sr)TiO$_3$ film.

Although Ru was employed also as a capacitor upper electrode, it is possible to employ other material for the electrode. For example, the same materials as useful for the lower electrode, as well as a high melting-point metal such as W, Mo or Ta, and a compound conductor such as WN$_x$ or MoN$_x$ can be employed.

EXAMPLE 11

Next, an eleventh embodiment of this invention will be explained. This Example also illustrates where this invention is applied to a dynamic random access memory as in the case of Example 10. FIGS. 22A to 22D illustrate the procedures of manufacturing the dynamic random access memory wherein Ru was also employed as a lower electrode of a capacitor in a memory cell where a capacitor was disposed at a location higher than any of the switching transistor, the word line and the bit line.

Figure 22A:
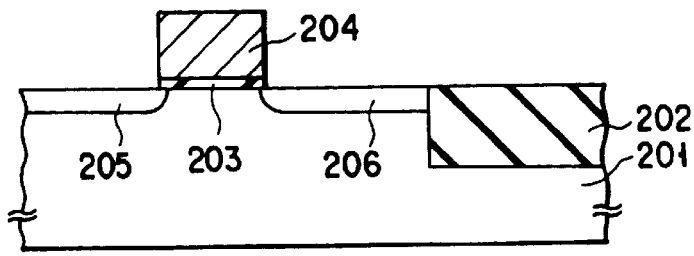
FIGS. 22A to 22D respectively shows a cross-sectional view illustrating a process for manufacturing a semiconductor device of an eleventh embodiment of this invention.

As shown in FIG. 22A, a predetermined surface portion of a p-type monocrystalline silicon substrate 201 having (100) crystal face and a specific resistance of 10 Ωcm was removed through etching thereby forming a hole in which an element isolation insulating film 202 was subsequently filled so as to form an element isolation region. Alternatively, this element isolation region may also be formed by making use of the conventional LOCOS method.

Then, a silicon oxide film 203 having a thickness of 20 nm for constituting a gate insulating film was formed by way of a thermal oxidation, and a tungsten silicide film 204 for constituting a gate electrode was deposited thereon. These films were patterned by means of a photolithography or a reactive ion etching to form a gate insulating electrode 203 and a gate electrode 204. Subsequently, an ion implantation was performed with this gate electrode 204 being used as a mask thereby forming in a self-aligned manner a source/drain region constituted by n$^-$-type diffusion regions 205 and 206, thus forming a metal oxide semiconductor field effect transistor as a switching transistor.

Figure 22B:
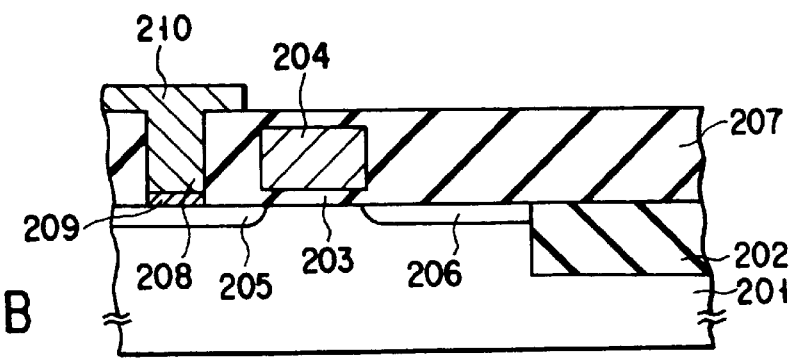

Then, as shown in FIG. 22B, silicon oxide film 207 was deposited by means of a CVD method to a thickness of 100 nm all over the upper surface of the MOSFET, and a contact hole 208 was formed by way of photolithography and reactive ion etching. Then, a titanium silicide film 209 was formed selectively on the bottom of the contact hole 208 and a W film 210 was deposited all over the upper surface of the device. Thereafter, the W film 210 was patterned by making use of photolithography and reactive ion etching, thus concurrently forming a bit line.

Figure 22C:
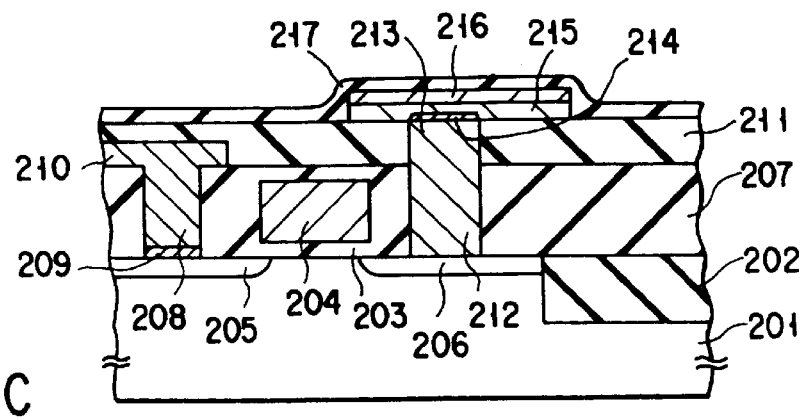

Then, after a CVD oxide film 211 was deposited as shown in FIG. 22C, the resultant surface was flattened. A contact hole 212 was then formed by way of photolithography, and an n$^+$-type polycrystal silicon film 213 was deposited all over the resultant upper surface. Thereafter, the n$^+$-type polycrystal silicon film 213 was left only in the contact hole by making use of a flattening method such as an etch-back, thus forming the n$^+$-type polycrystal silicon film (plug) 213 contacting with the n$^-$-type diffusion region 206.

Then, after depositing a thin RuO$_2$ film 215 having a thickness of 2 nm all over the resultant upper surface, a heat treatment was performed at a temperature of 400° C. or more thereby allowing the n$^+$-type polycrystal silicon film 213 to react with the thin RuO$_2$ film 215, thus forming a thin mixed oxide film 214 comprising Si and Ru. Subsequently, after a Ru film 216 was deposited all over the resultant upper surface, the patternings of the thin mixed oxide film 214, the thick RuO$_2$ film 215 and Ru film 216 were performed by means of photolithography. Thereafter, a PZT film 217 having a thickness of 20 nm was deposited all over the resultant surface by means of a CVD method.

Figure 22D:
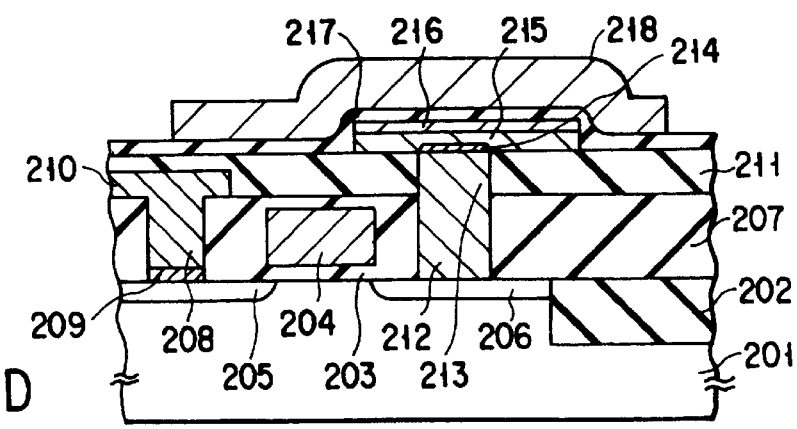

As shown in FIG. 22D, a TiN film 218 having a thickness of 80 nm was deposited on the PZT film 217 as an upper electrode (plate electrode), thereby manufacturing the cell of a dynamic random access memory. Thereafter, the ordinary procedures for completing the dynamic random access memory, such as a step of forming Al wirings were carried out, drawings for these steps being omitted herein.

In this Example, Ru was employed as a lower electrode for the capacitor, but other materials may also be employed in this invention. For example, Pt, Pd, Ir and Re which are capable of exhibiting conductivity even in the form of oxide thereof as in the case of Ru may be employed. The conductivity of these materials can be maintained even if they are in the form of a mixed oxide film with Si, and hence this mixed oxide layer effectively functions to prevent the metal electrode from reacting with the Si plug. However, as mentioned with reference to the aforementioned first to eighth embodiments, the employment of Ru containing extremely small quantities of oxygen is most preferable in view of preventing the silicification of the capacitor electrode.

Further, although a (Ba,Sr)TiO$_3$ film was employed as a capacitor dielectric film in this Example, other materials such as SrTiO$_3$, BaTiO$_3$, CaTiO$_3$, etc. may be employed in place of the (Ba,Sr)TiO$_3$ film.

Although TiN was employed also as a capacitor upper electrode, it is possible to employ other material for the electrode. For example, the same materials as useful for the lower electrode, as well as a high melting-point metal such as W, Mo or Ta, and a compound conductor such as WN$_x$ or MoN$_x$ can be employed.

EXAMPLE 12

Next, a twelfth embodiment of this invention will be explained. This Example also illustrates where this invention was applied to a dynamic random access memory as in the case of Examples 10 and 11. FIGS. 23A to 23D illustrate the procedures of manufacturing the dynamic random access memory wherein Ru was also employed as a lower electrode of a capacitor in a memory cell where a capacitor was disposed at a location higher than any of the switching transistor, the word line and the bit line.

Figure 23A:
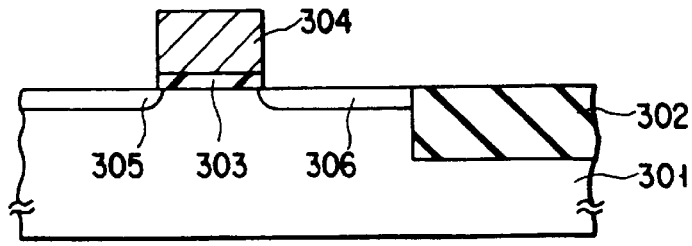
FIGS. 23A to 23D respectively shows a cross-sectional view illustrating a process for manufacturing a semiconductor device of a twelfth embodiment of this invention.

As shown in FIG. 23A, a predetermined surface portion of a p-type monocrystalline silicon substrate 301 having (100) crystal face and a specific resistance of 10 Ωcm was removed through etching thereby forming a hole in which an element isolation insulating film 302 was subsequently filled so as to form an element isolation region. Alternatively, this element isolation region may also be formed by making use of the conventional LOCOS method.

Then, a silicon oxide film 303 having a thickness of 10 nm for constituting a gate insulating film was formed by way of a thermal oxidation, and a tungsten silicide film 304 for constituting a gate electrode was deposited thereon. These films were patterned by means of a photolithography and a reactive ion etching to form a gate insulating electrode 303 and a gate electrode 304. Subsequently, an ion implantation was performed with this gate electrode 304 being used as a mask thereby forming in a self-aligned manner a source/drain region constituted by n$^+$-type diffusion regions 305 and 306, thus forming a metal oxide semiconductor field effect transistor as a switching transistor.

Figure 23B:
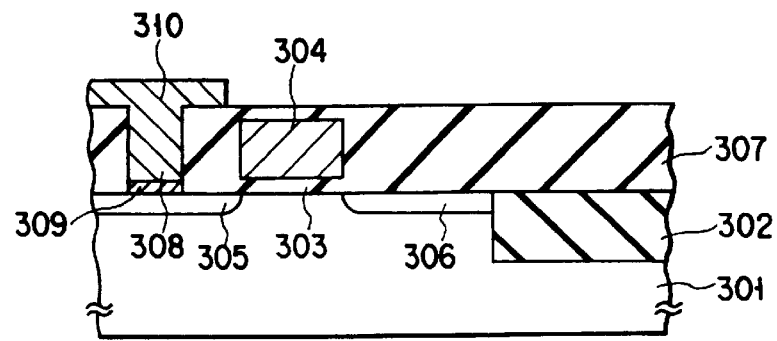

Then, as shown in FIG. 23B, silicon oxide film 307 was deposited by means of a CVD method to a thickness of 100 nm all over the upper surface of the metal oxide semiconductor field effect transistor, and a contact hole 308 was formed by way of photolithography and reactive ion etching. Then, a titanium silicide film 309 was formed selectively on the bottom of the contact hole 308 and a W film 310 was deposited all over the upper surface of the device. Thereafter, the W film 310 was patterned by making use of photolithography and reactive ion etching, thus concurrently forming a bit line.

Figure 23C:
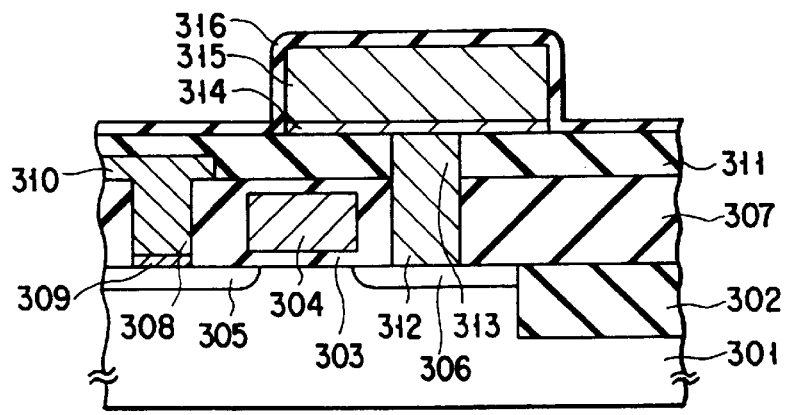

Then, after a CVD oxide film 311 was deposited as shown in FIG. 23C, the resultant surface was flattened. A contact hole 312 was then formed by way of photolithography, and an $n^+$-type polycrystal silicon film 313 was deposited all over the resultant upper surface. Thereafter, the $n^+$-type polycrystal silicon film 313 was left only in the contact hole by making use of a flattening method such as an etch-back, thus forming the $n^+$-type polycrystal silicon film 313 contacting with the n—type diffusion region 306.

Then, a thin mixed oxide film 314 comprising Si and Ru was formed all over the resultant upper surface by way of a two-source sputtering method using Ru source and Si source, or by way of a reactive sputtering method using as a target ruthenium silicide in an atmosphere containing oxygen. The thickness of the mixed oxide film 314 should preferably be 10 nm or less. Subsequently, after a Ru film 315 was deposited all over the resultant upper surface, the patternings of the thin mixed oxide film 314 and Ru film 315 were performed by means of photolithography and reactive ion etching. Thereafter, a $(Ba, Sr)TiO_3$ film 315 having a thickness of 20 nm was deposited all over the resultant surface by means of a CVD method.

Figure 23D:
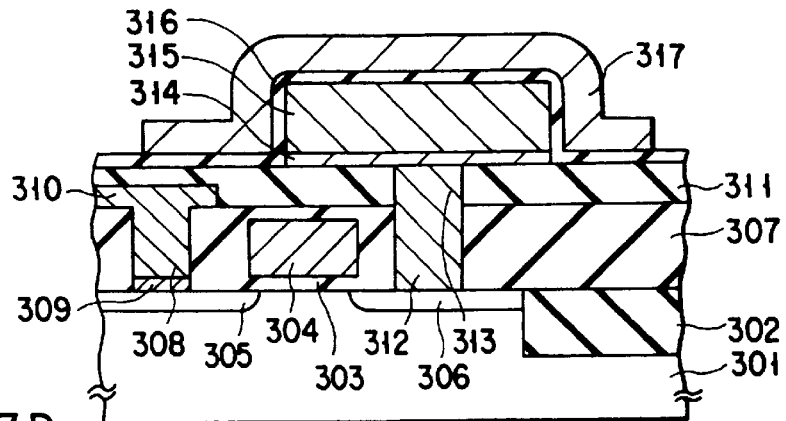

As shown in FIG. 23D, a $WN_x$ film 317 having a thickness of 80 nm was deposited all over the resultant upper surface as an upper electrode (plate electrode), thereby manufacturing the cell of a dynamic random access memory. Thereafter, the ordinary procedures for completing the dynamic random access memory including a step of forming Al wirings were carried out, drawings for these steps being omitted herein.

In this Example, Ru was employed as a lower electrode for the capacitor, but other materials may also be employed in this invention. For example, Pt, Pd, Ir and Re which are capable of exhibiting conductivity even in the form of oxide thereof as in the case of Ru may be employed. The conductivity of these materials can be maintained even if they are in the form of a mixed oxide film with Si, and hence this mixed oxide layer effectively functions to prevent the metal electrode from reacting with the Si plug.

Further, although a $(Ba,Sr)TiO_3$ film was employed as a capacitor dielectric film in this Example, other materials such as $SrTiO_3$, $BaTiO_3$, $CaTiO_3$, etc. may also be employed in place of the $(Ba,Sr)TiO_3$ film.

This invention can also be applied in place of the lower electrode of capacitor to the upper electrode. Specifically, this invention can be applied to the upper electrode of the capacitor in the dynamic random access memory cell structure shown in FIG. 19.

As for the capacitor dielectric film, it is possible to employ other materials such as $SrTiO_3$, $BaTiO_3$, $CaTiO_3$, a compound of these materials, $PbTiO_3$, PZT, etc. in place of the $(Ba,Sr)TiO_3$ film.

Although WN was employed as a capacitor upper electrode, it is possible according to this invention to employ other material for the electrode. For example, the same materials as useful for the lower electrode, as well as a high melting-point metal such as W, Mo or Ta, and a compound conductor such as $WN_x$ or $MoN_x$ can be employed.

In the above embodiment, after forming the dielectric film such as the $Ba_xSr_{1-x}TiO_3$ film, the heat treatment is carried out in an atmosphere containing oxygen. However, the present invention is not limited to this, and the heat treatment can be carried out in an atmosphere not containing oxygen.

As explained above, it is possible according to this invention to form a capacitor electrode which is low in resistance and free from silicification by employing a conductive material containing extremely small quantities of oxygen for the preparation of at least one electrode of a high dielectric capacitor. Therefore, it is possible, if this capacitor electrode is directly contacted with a Si plug or an impurity diffusion region on a Si substrate, to dispense with a diffusion-preventing film and to prepare a semiconductor device of high reliability at low cost. Namely, it is possible to provide a semiconductor device having a capacitor structure using a metal oxide for the capacitor insulating film and a method of manufacturing such a semiconductor device, wherein a diffusion-preventing film can be omitted and the silicification of the capacitor electrode can be prevented.

Furthermore, it is possible according to this invention to provide a semiconductor device which is capable of preventing the increasing of the contact resistance resulting from the oxidation of a barrier metal by interposing a mixed oxide layer comprising a metal element constituting the electrode of a capacitor and silicon at an interface between the electrode of the capacitor and the underlying silicon, the electrode of the capacitor being constituted by a metal element or a compound thereof which is capable of keeping a conductivity even in the form of an oxide.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device provided with a capacitor comprising a first electrode, a dielectric film, and a second electrode which comprises the steps of:

forming the first electrode on a semiconductor substrate;
   forming the dielectric film made of a metal oxide on said first electrode; and
   forming the second electrode on said dielectric film,
   wherein at least one of said first electrode and said second electrode is formed by sputtering at least one element selected from either one of Group 7A and Group 8 elements belonging to either one of the fifth and sixth periods of Periodic Table in an atmosphere containing oxygen, at least one of said first electrode and said second electrode containing oxygen, a content of which is less than a stoichiometric quantity of oxygen that can exist in a form of an oxide of said element.

2. The method of manufacturing a semiconductor device according to claim 1, wherein said atmosphere containing oxygen has an oxygen concentration of 1 to 40%.

3. The method of manufacturing a semiconductor device according to claim 1, wherein said one of Group 7A and Group 8 elements is at least one kind of elements selected from the group consisting of platinum, ruthenium, palladium, rhenium, osmium, iridium and rhodium.

4. The method of manufacturing a semiconductor device according to claim 1, further comprising a step of heat treatment after the formation of said metal film containing oxygen.

5. The method of manufacturing a semiconductor device according to claim 1, further comprising a step of heat treatment after patterning said metal film to form said first electrode.

6. A method of manufacturing a semiconductor device provided with a capacitor comprising a first electrode, a dielectric film, and a second electrode which comprises the steps of:

forming the first electrode on a semiconductor substrate;

forming the dielectric film made of a metal oxide on said first electrode; and forming the second electrode on said dielectric film, wherein at least one of said first electrode and said second electrode is formed by depositing a metal film by subjecting at least one element selected from either one of Group 7A and Group 8 elements belonging to either one of the fifth and sixth periods of Periodic Table to a chemical vapor phase growth in an atmosphere containing oxygen, said metal film containing oxygen, a content of which is less than a stoichiometric quantity of oxygen that can exist in a form of an oxide of said element.

7. The method of manufacturing a semiconductor device according to claim 6, wherein said atmosphere containing oxygen has an oxygen concentration of 1 to 40%.

8. The method of manufacturing a semiconductor device according to claim 6, wherein said one of Group 7A and Group 8 elements is at least one kind of elements selected from the group consisting of platinum, ruthenium, palladium, rhenium, osmium, iridium and rhodium.

9. The method of manufacturing a semiconductor device according to claim 6, further comprising a step of heat treatment after the formation of said metal film containing oxygen.

10. The method of manufacturing a semiconductor device according to claim 6, further comprising a step of heat treatment after patterning said metal film to form said first electrode.

* * * * *